(12) United States Patent
Uzoh

(10) Patent No.: US 11,908,739 B2
(45) Date of Patent: Feb. 20, 2024

(54) FLAT METAL FEATURES FOR MICROELECTRONICS APPLICATIONS

(71) Applicant: ADEIA SEMICONDUCTOR TECHNOLOGIES LLC, San Jose, CA (US)

(72) Inventor: Cyprian Emeka Uzoh, San Jose, CA (US)

(73) Assignee: ADEIA SEMICONDUCTOR TECHNOLOGIES LLC, San Jose, CA (US)

( * ) Notice: Subject to any disclaimer, the term of this patent is extended or adjusted under 35 U.S.C. 154(b) by 385 days.

(21) Appl. No.: 17/098,128

(22) Filed: Nov. 13, 2020

(65) Prior Publication Data
US 2021/0082754 A1    Mar. 18, 2021

Related U.S. Application Data

(62) Division of application No. 16/563,512, filed on Sep. 6, 2019, now Pat. No. 10,840,135, which is a division
(Continued)

(51) Int. Cl.
*H01L 21/768* (2006.01)
*H01L 21/321* (2006.01)
(Continued)

(52) U.S. Cl.
CPC .... *H01L 21/76883* (2013.01); *H01L 21/3212* (2013.01); *H01L 21/7684* (2013.01);
(Continued)

(58) Field of Classification Search
CPC ... H01L 2224/08111; H01L 2224/0812; H01L 2224/08121; H01L 2224/08123;
(Continued)

(56) References Cited

U.S. PATENT DOCUMENTS

| 4,939,568 A | 7/1990 | Kato et al. |
| 4,998,665 A | 3/1991 | Hayashi |

(Continued)

FOREIGN PATENT DOCUMENTS

| CN | 1112286 A | 11/1995 |
| CN | 107256852 B | 9/2019 |

(Continued)

OTHER PUBLICATIONS

Basol et al., "Growth of Planarized Copper Film by ECMD Deposition Technique," ERC Retreat, Stanford University, Palo Alto, CA, Aug. 21-22, 2003 (reference not found).
(Continued)

*Primary Examiner* — Robert G Bachner
*Assistant Examiner* — Molly K Reida
(74) *Attorney, Agent, or Firm* — Knobbe, Martens, Olson & Bear, LLP

(57) ABSTRACT

Advanced flat metals for microelectronics are provided. While conventional processes create large damascene features that have a dishing defect that causes failure in bonded devices, example systems and methods described herein create large damascene features that are planar. In an implementation, an annealing process creates large grains or large metallic crystals of copper in large damascene cavities, while a thinner layer of copper over the field of a substrate anneals into smaller grains of copper. The large grains of copper in the damascene cavities resist dishing defects during chemical-mechanical planarization (CMP), resulting in very flat damascene features. In an implementation, layers of resist and layers of a second coating material may be applied in various ways to resist dishing during chemical-mechanical planarization (CMP), resulting in very flat damascene features.

15 Claims, 16 Drawing Sheets

Related U.S. Application Data of application No. 15/994,435, filed on May 31, 2018, now Pat. No. 10,446,441.

(60) Provisional application No. 62/515,410, filed on Jun. 5, 2017.

(51) Int. Cl.
  *H01L 23/532* (2006.01)
  *H01L 23/00* (2006.01)

(52) U.S. Cl.
  CPC .... *H01L 21/7688* (2013.01); *H01L 21/76843* (2013.01); *H01L 21/76874* (2013.01); *H01L 21/76879* (2013.01); *H01L 24/03* (2013.01); *H01L 23/53214* (2013.01); *H01L 23/53228* (2013.01); *H01L 23/53242* (2013.01); *H01L 23/53257* (2013.01); *H01L 24/05* (2013.01); *H01L 24/80* (2013.01); *H01L 2224/034* (2013.01); *H01L 2224/039* (2013.01); *H01L 2224/03602* (2013.01); *H01L 2224/03848* (2013.01); *H01L 2224/08121* (2013.01); *H01L 2224/08123* (2013.01); *H01L 2224/08147* (2013.01); *H01L 2224/80194* (2013.01); *H01L 2224/80895* (2013.01); *H01L 2224/80896* (2013.01)

(58) Field of Classification Search
  CPC . H01L 2224/08135; H01L 2224/08145; H01L 2224/08146; H01L 2224/08147; H01L 2224/80357
  See application file for complete search history.

(56) References Cited

U.S. PATENT DOCUMENTS

| | | | |
|---|---|---|---|
| 5,087,585 A | 2/1992 | Hayashi |
| 5,236,118 A | 8/1993 | Bower et al. |
| 5,322,593 A | 6/1994 | Hasegawa et al. |
| 5,413,952 A | 5/1995 | Pages et al. |
| 5,442,235 A | 8/1995 | Parrillo et al. |
| 5,489,804 A | 2/1996 | Pasch |
| 5,501,003 A | 3/1996 | Bernstein |
| 5,503,704 A | 4/1996 | Bower et al. |
| 5,516,727 A | 5/1996 | Broom |
| 5,610,431 A | 3/1997 | Martin |
| 5,734,199 A | 3/1998 | Kawakita et al. |
| 5,753,536 A | 5/1998 | Sugiyama et al. |
| 5,771,555 A | 6/1998 | Eda et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,063,968 A | 5/2000 | Hubner et al. |
| 6,071,761 A | 6/2000 | Jacobs |
| 6,080,640 A | 6/2000 | Gardner et al. |
| 6,097,096 A | 8/2000 | Gardner et al. |
| 6,117,784 A | 9/2000 | Uzoh |
| 6,123,825 A | 9/2000 | Uzoh et al. |
| 6,147,000 A | 11/2000 | You et al. |
| 6,232,150 B1 | 5/2001 | Lin et al. |
| 6,258,625 B1 | 7/2001 | Brofman et al. |
| 6,259,160 B1 | 7/2001 | Lopatin et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,333,120 B1 | 12/2001 | DeHaven et al. |
| 6,333,206 B1 | 12/2001 | Ito et al. |
| 6,348,709 B1 | 2/2002 | Graettinger et al. |
| 6,374,770 B1 | 4/2002 | Lee |
| 6,409,904 B1 | 6/2002 | Uzoh et al. |
| 6,423,640 B1 | 7/2002 | Lee et al. |
| 6,465,892 B1 | 10/2002 | Suga |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,600,224 B1 | 7/2003 | Farquhar et al. |
| 6,624,003 B1 | 9/2003 | Rice |
| 6,627,814 B1 | 9/2003 | Stark |
| 6,632,377 B1 | 10/2003 | Brusic et al. |
| 6,660,564 B2 | 12/2003 | Brady |
| 6,667,225 B2 | 12/2003 | Hau-Riege et al. |
| 6,828,686 B2 | 12/2004 | Park |
| 6,837,979 B2 | 1/2005 | Uzoh et al. |
| 6,864,585 B2 | 3/2005 | Enquist |
| 6,887,769 B2 | 5/2005 | Kellar et al. |
| 6,902,987 B1 | 6/2005 | Tong et al. |
| 6,908,027 B2 | 6/2005 | Tolchinsky et al. |
| 6,909,194 B2 | 6/2005 | Farnworth et al. |
| 6,962,835 B2 | 11/2005 | Tong et al. |
| 6,974,769 B2 | 12/2005 | Basol et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,109,063 B2 | 9/2006 | Jiang |
| 7,126,212 B2 | 10/2006 | Enquist et al. |
| 7,193,423 B1 | 3/2007 | Dalton et al. |
| 7,238,919 B2 | 7/2007 | Kaneko et al. |
| 7,354,798 B2 | 4/2008 | Pogge et al. |
| 7,485,968 B2 | 2/2009 | Enquist et al. |
| 7,750,488 B2 | 7/2010 | Patti et al. |
| 7,803,693 B2 | 9/2010 | Trezza |
| 7,998,335 B2 | 8/2011 | Feeney et al. |
| 8,039,966 B2 | 10/2011 | Yang et al. |
| 8,101,858 B2 | 1/2012 | Hannour et al. |
| 8,168,532 B2 | 5/2012 | Haneda et al. |
| 8,183,127 B2 | 5/2012 | Patti et al. |
| 8,241,961 B2 | 8/2012 | Kim et al. |
| 8,242,600 B2 | 8/2012 | Yang et al. |
| 8,314,007 B2 | 11/2012 | Vaufredaz |
| 8,349,635 B1 | 1/2013 | Gan et al. |
| 8,377,798 B2 | 2/2013 | Peng et al. |
| 8,435,421 B2 | 5/2013 | Keleher et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,728,934 B2 | 5/2014 | Uzoh et al. |
| 8,802,538 B1 | 8/2014 | Liu |
| 8,809,123 B2 | 8/2014 | Liu et al. |
| 8,841,002 B2 | 9/2014 | Tong |
| 8,988,299 B2 | 3/2015 | Kam et al. |
| 9,000,600 B2 | 4/2015 | Uzoh et al. |
| 9,028,755 B2 | 5/2015 | Itoh |
| 9,093,350 B2 | 7/2015 | Endo et al. |
| 9,123,703 B2 | 9/2015 | Uzoh et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,269,612 B2 | 2/2016 | Chen et al. |
| 9,299,736 B2 | 3/2016 | Chen et al. |
| 9,312,229 B2 | 4/2016 | Chen et al. |
| 9,318,385 B2 | 4/2016 | Uzoh et al. |
| 9,331,149 B2 | 5/2016 | Tong et al. |
| 9,337,235 B2 | 5/2016 | Chen et al. |
| 9,343,330 B2 | 5/2016 | Brusic et al. |
| 9,349,669 B2 | 5/2016 | Uzoh et al. |
| 9,368,866 B2 | 6/2016 | Yu |
| 9,385,024 B2 | 7/2016 | Tong et al. |

(56) References Cited

U.S. PATENT DOCUMENTS

| | | |
|---|---|---|
| 9,394,161 B2 | 7/2016 | Cheng et al. |
| 9,431,368 B2 | 8/2016 | Enquist et al. |
| 9,433,093 B2 | 8/2016 | Uzoh |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,633,971 B2 | 4/2017 | Uzoh |
| 9,656,852 B2 | 5/2017 | Cheng et al. |
| 9,666,573 B1 | 5/2017 | Sukekawa |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,147,641 B2 | 12/2018 | Enquist et al. |
| 10,204,893 B2 | 2/2019 | Uzoh et al. |
| 10,269,708 B2 | 4/2019 | Enquist et al. |
| 10,269,756 B2 | 4/2019 | Uzoh |
| 10,276,619 B2 | 4/2019 | Kao et al. |
| 10,276,909 B2 | 4/2019 | Huang et al. |
| 10,314,175 B2 | 6/2019 | Sato et al. |
| 10,418,277 B2 | 9/2019 | Cheng et al. |
| 10,434,749 B2 | 10/2019 | Tong et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,515,913 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,908,173 B2 | 2/2021 | Yamasaki et al. |
| 10,923,408 B2 | 2/2021 | Huang et al. |
| 10,923,413 B2 | 2/2021 | DeLaCruz |
| 10,937,755 B2 | 3/2021 | Shah et al. |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,515,279 B2 | 11/2022 | Uzoh et al. |
| 2002/0000328 A1 | 1/2002 | Motomura et al. |
| 2002/0003307 A1 | 1/2002 | Suga |
| 2002/0025665 A1 | 2/2002 | Juengling |
| 2002/0047208 A1 | 4/2002 | Uzoh et al. |
| 2002/0074670 A1 | 6/2002 | Suga |
| 2002/0094661 A1 | 7/2002 | Enquist et al. |
| 2003/0092220 A1 | 5/2003 | Akram |
| 2003/0157748 A1 | 8/2003 | Kim et al. |
| 2004/0052390 A1 | 3/2004 | Morales et al. |
| 2004/0052930 A1 | 3/2004 | Basol et al. |
| 2004/0084414 A1 | 5/2004 | Sakai et al. |
| 2004/0238492 A1 | 12/2004 | Catabay et al. |
| 2006/0024950 A1 | 2/2006 | Choi et al. |
| 2006/0057945 A1 | 3/2006 | Hsu et al. |
| 2007/0096294 A1 | 5/2007 | Ikeda et al. |
| 2007/0111386 A1 | 5/2007 | Kim et al. |
| 2008/0073795 A1 | 3/2008 | Kohl et al. |
| 2008/0122092 A1 | 5/2008 | Hong |
| 2008/0237053 A1 | 10/2008 | Andricacos et al. |
| 2009/0197408 A1 | 8/2009 | Lehr et al. |
| 2009/0200668 A1 | 8/2009 | Yang et al. |
| 2010/0255262 A1 | 10/2010 | Chen et al. |
| 2010/0327443 A1 | 12/2010 | Kim |
| 2011/0074040 A1 | 3/2011 | Frank et al. |
| 2011/0084403 A1 | 4/2011 | Yang et al. |
| 2012/0211894 A1 | 8/2012 | Aoyagi |
| 2012/0212384 A1 | 8/2012 | Kam et al. |
| 2013/0009321 A1 | 1/2013 | Kagawa et al. |
| 2013/0020704 A1 | 1/2013 | Sadaka |
| 2013/0221527 A1 | 8/2013 | Yang et al. |
| 2013/0252399 A1 | 9/2013 | Leduc |
| 2013/0320556 A1 | 12/2013 | Liu et al. |
| 2014/0153210 A1 | 6/2014 | Uzoh |
| 2014/0175655 A1 | 6/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0340269 A1 | 11/2015 | Rivoire et al. |
| 2015/0380368 A1 | 12/2015 | Momose et al. |
| 2016/0020183 A1 | 1/2016 | Chuang et al. |
| 2016/0133598 A1 | 5/2016 | Baudin et al. |
| 2016/0276383 A1 | 9/2016 | Chuang et al. |
| 2016/0343682 A1 | 11/2016 | Kawasaki |
| 2017/0025381 A1 | 1/2017 | Tsai et al. |
| 2017/0047307 A1 | 2/2017 | Uzoh |
| 2017/0069575 A1 | 3/2017 | Haba et al. |
| 2017/0086320 A1 | 3/2017 | Barber |
| 2017/0141079 A1* | 5/2017 | Kao ................. H01L 24/80 |
| 2017/0194271 A1 | 7/2017 | Hsu et al. |
| 2017/0330855 A1 | 11/2017 | Tung et al. |
| 2017/0355040 A1 | 12/2017 | Utsumi et al. |
| 2018/0151523 A1 | 5/2018 | Chen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |

(56) References Cited

U.S. PATENT DOCUMENTS

| | | |
|---|---|---|
| 2019/0319007 A1 | 10/2019 | Uzoh et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2019/0393086 A1 | 12/2019 | Uzoh |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0075553 A1 | 3/2020 | DeLaCruz et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0381389 A1 | 12/2020 | Uzoh et al. |
| 2020/0395321 A1 | 12/2020 | Katkar et al. |
| 2020/0411483 A1 | 12/2020 | Uzoh et al. |
| 2021/0098411 A1 | 4/2021 | Liff et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0234070 A1 | 7/2021 | Brueck et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0130787 A1 | 4/2022 | Uzoh |
| 2022/0139867 A1 | 5/2022 | Uzoh |
| 2022/0139869 A1 | 5/2022 | Gao et al. |
| 2022/0157752 A1 | 5/2022 | Bourjot et al. |
| 2022/0165692 A1 | 5/2022 | Uzoh et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005849 A1 | 1/2023 | Chuang |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |

FOREIGN PATENT DOCUMENTS

| | | |
|---|---|---|
| JP | 2000-183061 A | 6/2000 |
| JP | 2002-353416 A | 12/2002 |
| JP | 2013-033786 A | 2/2013 |
| JP | 2018-129475 | 8/2018 |
| JP | 2018-160519 | 10/2018 |
| KR | 10-2008-0050129 A | 6/2008 |
| KR | 10-2016-0066272 | 6/2016 |
| WO | WO 2005/043584 A2 | 5/2005 |
| WO | WO 2009/021266 A1 | 2/2009 |

OTHER PUBLICATIONS

Basol et al., "Study on the Mechanism of Electrochemical Mechanical Deposition of Copper Layers," Nu Tool Inc., 1655 McCandless Drive, Milpitas, California 95035, Electrochemical Processes in ULSI and MEMS, Proceedings of the International Symposium; Proceedings vol. 2004-17, p. 155-160.

Khan, Muhammed et al., "Damascene Process and Chemical Mechanical Planarization," http://www.ece.umd.edu/class/enee416/GroupActivities/Damascene%20Presentation.pdf, 25 pages.

Final Office Action dated Apr. 28, 2020 for U.S. Appl. No. 16/563,512 "Flat Metal Features for Microelectronics Applications", Uzoh, 7 pages.

Office Action for U.S. Appl. No. 16/563,512, dated Jan. 23, 2020, Uzoh, "Flat Metal Features for Microelectronics Applications", 9 pages.

International Search Report and Written Opinion, dated Nov. 1, 2018, for PCT Application No. PCT/US2018/035947, 31 pages.

Akolkar, R., "Current status and advances in Damascene Electrodeposition," Encyclopedia of Interfacial Chemistry: Surface Science and Electrochemistry, 2017, 8 pages.

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of The Electrochemical Society, 2011, vol. 158, No. 6, pp. P81-P86.

Ganesan, Kousik, "Capable copper electrodeposition process for integrated circuit—substrate packaging manufacturing, " A dissertation presented in partial fulfillment of the requirements for the degree Doctor of Philosophy, Arizona State University, May 2018, 320 pages.

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrusion for TSV wafer fabrication," Journal of Electronic Materials, 2012, vol. 41, No. 9, pp. 2533-2542.

(56) References Cited

OTHER PUBLICATIONS

Hobbs, Anthony et al., "Evolution of grain and micro-void structure in electroplated copper interconnects," Materials Transactions, 2002, vol. 43, No. 7, pp. 1629-1632.
Huang, Q., "Effects of impurity elements on isothermal grain growth of electroplated copper," Journal of The Electrochemical Society, 2018, vol. 165, No. 7, pp. D251-D257.
Huang, Q., "Impurities in the electroplated sub-50 nm Cu lines: The effects of the plating additives," Journal of The Electrochemical Society, 2014, vol. 161, No. 9, pp. D388-D394.
Jiang, T. et al., "Plasticity mechanism for copper extrusion in through-silicon vias for three-dimensional interconnects," Applied Physics Letters, 2013, vol. 103, pp. 211906-1-211906-5.
Juang, Jing-Ye et al., "Copper-to-copper direct bonding on highly (111)-oriented nanotwinned copper in no-vacuum ambient," Scientific Reports, Sep. 17, 2018, vol. 8, 11 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim, Myung Jun et al., "Characteristics of pulse-reverse electrodeposited Cu thin film," I. Effects of Anodic Step in the Absence of an Organic Additives, Journal of The Electrochemical Society, 2012, vol. 159, No. 9, pp. D538-D543.
Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.
Liu, C. et al., "Low-temperature direct copper-to-copper bonding enabled by creep on (111) surfaces of nanotwinned Cu," Scientific Reports, May 12, 2015, 5:09734, pp. 1-11.
Liu, Chien-Min et al., "Effect of grain orientations of Cu seed layers on the growth of <111>-oriented nanotwinned Cu," Scientific Reports, 2014, vol. 4, No. 6123, 4 pages.
Liu, Zi-Yu et al. "Detection and formation mechanism of micro-defects in ultrafine pitch Cu—Cu direct bonding," Chin. Phys. B, 2016, vol. 25, No. 1, pp. 018103-1-018103-7.
Lu, L. et al., "Grain growth and strain release in nanocrystalline copper," Journal of Applied Physics, vol. 89, Issue 11, pp. 6408.
Mendez, Julie Marie, "Characterization of copper electroplating and electropolishing processes for semiconductor interconnect metallization," Submitted in partial fulfillment of the requirements for the degree of Doctor of Philosophy, Department of Chemical Engineering, Case Western Reserve University, Aug. 2009, 140 pages.
Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.
Moriceau, H. et al., "Overview of recent direct wafer bonding advances and applications," Advances in Natural Sciences—Nanoscience and Nanotechnology, 2010, 11 pages.
Mott, D. et al., "Synthesis of size-controlled and shaped copper nanoparticles," Langmuir, 2007, vol. 23, No. 10, pp. 5740-5745.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Ortleb, Thomas et al., "Controlling macro and micro surface topography for a 45nm copper CMP process using a high resolution profiler," Proc. Of SPIE, 2008, vol. 6922, 11 pages.
Parthasaradhy, N.V., "Practical Electroplating Handbook," 1989, Prentice-Hall, Inc., pp. 54-56.
Plobi, A. et al., "Wafer direct bonding: tailoring adhesion between brittle materials," Materials Science and Engineering Review Journal, 1999, R25, 88 pages.
Saraswat, Stanford Presentation, Cu Interconnect slides, web page web.stanford.edu/class/ee311/NOTES/Cu_Interconnect_Slides.pdf, 19 pages.
Song, Xiaohui, "Atomic study of copper-copper bonding using nanoparticles," Journal of Electronic Packaging, Jun. 2020, vol. 142, 5 pages.
Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Swingle, Karen D., "Nanograin Copper Deposition Using an Impinging Jet Electrode," A Thesis submitted in partial satisfaction of the requirements of the degree of Master of Science, University of California, San Diego, 2013, 102 pages.
Takahashi, K. et al., "Transport phenomena that control electroplated copper filling of submicron vias and trenches," Journal of The Electrochemical Society, 1999, vol. 146, No. 12, pp. 4499-4503.
Zheng, Z. et al., "Study of grain size effect of Cu metallization on interfacial microstructures of solder joints," Microelectronics Reliability, 2019, vol. 99, pp. 44-51.
Basol et al, "Electrochemical mechanical deposition (ECMDT) technique for semiconductor interconnect applications," Microelectronic Engineering, 2002, vol. 64, pp. 43-51.
Basol et al., "Planar copper plating and electropolishing techniques," Chemical Engineering Communication, Jul. 2006, 14 pages.
Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
ONSEMI AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, ElectronicsWeekly.com ("Bush article"); however, the imaged part and the part shown in the Bush article share the part number "ONSEMI AR0820.".
Roy, A. et al., "Annealing effects on the surface properties of Cu—TiC thin films," Materials Today: Proceedings, 2021, vol. 44, Part 1, pp. 170-175.
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260.".
Zik, N. et al., "Thermally produced nano catalyst for biodiesel production: A review," Journal of Advanced Research in Fluid Mechanics and Thermal Sciences, 2018, vol. 52, Issue 2, pp. 139-147.

* cited by examiner

FLAT METAL FEATURES FOR MICROELECTRONICS APPLICATIONS

RELATED APPLICATION

This patent application is a divisional of and claims priority to U.S. patent application Ser. No. 16/563,512, filed Sep. 6, 2019, which is a divisional of U.S. patent application Ser. No. 15/994,435, filed May 31, 2018, now U.S. Pat. No. 10,446,441, issued Oct. 15, 2019, which claims the benefit of priority to U.S. Provisional Patent Application No. 62/515,410, filed Jun. 5, 2017, which are incorporated herein by reference in their entirety.

BACKGROUND

In the back-end-of-line metallization layers formed during fabrication of integrated circuits, copper is typically used for electrical interconnections. Conductive copper features using a damascene, dual-damascene or via process begin with etching patterns in order to create open trenches, vias, or other cavities where the copper features will be inlayed, in an underlying substrate, such as silicon, silicon oxide, or a low-dielectric-constant (low k dielectric) insulating layer. A barrier/adhesion layer is coated over the etched and patterned substrate, and copper metal is typically deposited on the substrate to overfill the open cavities. A thermal treatment can be performed to stabilize the grain structure of the metal. A chemical-mechanical planarization (CMP) process may then be applied to remove the unwanted metal overburden that extends above the top surface of the substrate. The copper metal, for example, that remains in the substrate becomes the patterned copper conductor for circuits of the integrated circuit.

Successive layers of insulator material and copper can build a multilayered interconnection structure. One or more CMP processes remove the overburden copper and the barrier layer in a planar and uniform manner, ideally stopping at each substrate surface. However, over the patterned copper conductor features, the CMP process may introduce some dishing in larger copper features that have a larger surface area, because the copper is often softer than the dielectric layer, which may be silicon oxide, silicon nitride, silicon oxynitride, silicon carbide, diamond-like-carbon or the like. The larger the width of the cavity that has been filled with copper metal, for example, the larger the observed dishing during the polishing.

As shown in FIG. 1, dishing 100 is a concave dip defect in the top surface 102 of a metal feature 104, and the dishing 100 becomes more pronounced in relation to the width 106 of the metal feature 104, especially for large damascene features 104 with widths 106 greater than 4 microns (4µ). Typically, the dishing 100 increases with increasing width of the conductive feature 106. The fabrication process begins with a barrier 108 and seed layer 110 deposited in cavities 112 (trenches or vias) of an insulator or semiconductive substrate 114.

The cavities 112 may then be plated with metal to overfill the cavity and cover the surface surrounding the cavity 112, which may be referred to as the "field" to distinguish this surface area from the cavity itself. In one example, for copper deposited from an appropriate conventional copper additive plating bath, a field metal thickness $T_f$ 116 and a cavity metal thickness $T_c$ 118 are similar in thickness. The field metal thickness $T_f$ 116 is typically greater than the overburden metal thickness $T_o$ 120 over the cavities 112. After thermal treatment to partially stabilize the grain structure of the metal, the grain size of the metal field metal thickness $T_f$ 116 is similar to the grain size of the cavity metal thickness $T_c$ 118.

A planarization process, such as a CMP process (illustrated by dashed arrow 122) stops at the barrier layer 108 over the field after polishing with a deformable pad. On account of the similar grain size between the field metal $T_f$ 116 and the cavity metal $T_c$ 118, the removal rates of the field metal $T_f$ 116 and the cavity metal $T_c$ 118 are quite similar with a given etchant or polishing slurry.

Then, after removal of the barrier layer 108, the substrate 114 has metal features 104 with the excessive dishing 100. As an example, for a one-micron deep cavity with a width 106 of 4-10 microns, the dishing 100 may vary between 10-50 nm. For larger cavities (in diameter, length, width, etc.) the dishing 100 may readily exceed 30 nm.

When two metal features 104 & 104' are joined to make a bonded feature 124, such as a conductive connection (with each other) for large pad bonding, the dishing 100 on both surfaces creates an unwanted space 126 between the surfaces of the two metal features 104 & 104'. The unwanted space 126 may be continuous or discontinuous along the width of the cavities in the bonded metal features 104 and 104'. In some examples, the length of the unwanted cavity (dishing) 126 may comprise a dip magnitude that is 5-60% of the width 106 of the width of the metal feature 104 in the dielectric cavity. The dishing 100 and spaces 126 are unacceptable defects in bonded damascene features, and such large defects are a major source of failure in bonded devices.

FIG. 2 shows an example conventional approach for creating bonded features, when dishing is present. In diagram 200, a substrate with a conductive feature with excessive dishing and dielectric erosion has a pad opening dimension $P_1$. In diagram 202, the substrate has been coated with one or more layers of dielectric material. In diagram 204, the dielectric has been planarized. In diagram 206, lithographic patterning is formed atop the planarized dielectric. In diagram 208, single or dual damascene etching processes form a second pad opening $P_2$, where $P_2$ is less than $P_1$. In diagram 210, a barrier layer and seed layer (not shown) have been placed, and metal deposition has occurred. The plated metal is annealed to partially stabilize the grains of the coated metal. In diagram 212, metal planarization is performed. In diagram 214, two damascene features are bonded after surface preparation and substrate assembly.

The example conventional approach of FIG. 2 has some drawbacks and limitations. First, more than seven additional steps are needed to solve the initial dishing of the large damascene features after CMP. Secondly, the second pad opening $P_2$ in diagram 212 is always smaller than the first pad opening $P_1$. Thirdly, this technique, used in some instances when creating direct bond interconnect (DBI®) hybrid bonding layers, can be relatively expensive. Fourth, the example conventional approach results in a loss of wiring freedom or design flexibility in which coplanar large metal and small metal features are components of the bonding surface.

SUMMARY

Advanced flat metals for microelectronics and advanced device packaging are provided. While conventional processes create large damascene features that have a large dishing defect, which causes failure in bonded devices, example systems and methods described herein create large damascene features that are planar. In one example, methods described herein create planar small, medium and large features on a bonding surface. In another example, the method of this invention creates a bonded apparatus wherein the bonded surfaces may comprise small, medium and large damascene cavities. In an implementation, large grains or large metallic crystals are formed in large ($T_c$) damascene cavities and much smaller grains or metallic crystals are formed in thinner ($T_f$) field metal regions. The etching rate or removal rate of the smaller metal grains in the field is higher than those of the large metal grains in the cavity. This differential removal rate between the field metal with thickness $T_f$ and cavity metal with larger thickness $T_c$ produces slightly domed metal features over damascene cavities. Further polishing of the substrate produces flat metal features over the various damascene cavities. In some embodiments, the metal features are planar in metal widths varying from submicron features to features larger than 30 microns. In other embodiments, the width of the planar cavities exceeds 31 microns, and the related dishing may be less than 10 nm or, in many cases, less than 3 nm.

In various implementations, layers of resist and layers of a second coating material may be applied in various ways to resist dishing during chemical-mechanical planarization (CMP), resulting in very flat damascene features.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

Figure 1:
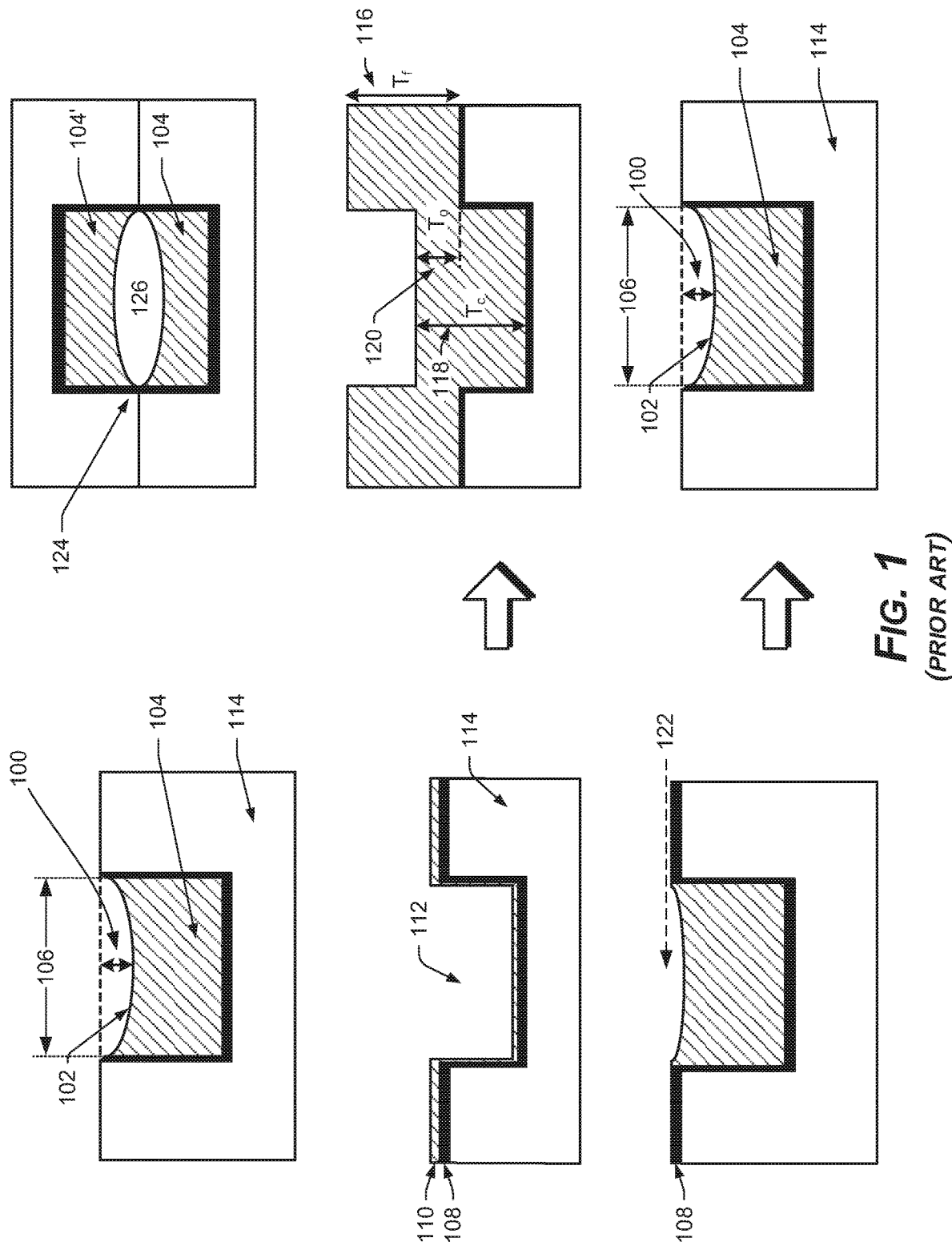
FIG. 1 is a diagram of a conventional dishing defect in the top surface of a metal feature.

This disclosure describes advanced flat metals for microelectronics and packaging applications. While conventional processes create large damascene features that have high dishing defects that can cause failure in bonded devices, example systems and methods described herein create large damascene features that are planar or substantially planar. In an implementation, after depositing metal within large cavities of a substrate, the metal is formed in such a manner that the metal is vertically thicker within the cavity than the metal on the surrounding field portion of the substrate nearby the cavities. An annealing process is applied, for example at approximately 25-150° C., which creates large metal grains and large metallic crystals of the metal, such as copper, within the larger cavities, and creates smaller metal grains and smaller metallic crystals of the copper on the thinner field portion of the substrate. The polishing rate and removal rate of the smaller metal grains in the field is higher than the polishing and removal rates of the large metal grains within the cavities. This differential removal rate between the field metal and the cavity metal produces slightly domed metal features over damascene cavities. Further polishing down to the substrate can produce flat metal features over the various large damascene cavities. In some embodiments, the polished metal features have widths varying from the submicron range to metal features spanning cavities larger than 10 microns. In other embodiments, the width of the planar metal features spanning cavities exceeds 40 microns, and the related dishing is less than 10 nm, or sometimes even less than 3 nm, across the surface of the metal feature. The relatively large grains of copper within the damascene cavities have lower removal rates than the smaller copper grains in the field during chemical-mechanical planarization (CMP), resulting in very flat features across a die or across the surface of the planarized substrate.

In an implementation, layers of resist and layers of a second coating material may be applied in various ways to further resist dishing defects during chemical-mechanical planarization (CMP), resulting in very flat damascene metal features.

Achievement of the advanced flat metals described herein can extend the range of DBI® hybrid bonding processes (Invensas Bonding Technologies, Inc., San Jose, CA) to large metal features of 10-1000 μm size, for example. DBI® hybrid bonding is a low temperature direct bonding technology that allows wafer-to-wafer and die-to-wafer bonding with typically fine-pitch 3D electrical interconnects. The wafers or die surfaces are planarized and bond pads can be flat or slightly recessed in a dielectric layer. The wafers or die are then aligned and bonded at room temperature. The metal interconnects may be formed or improved during a subsequent higher temperature annealing step. The advanced flat metals described herein can also allow formation of the direct bond interface hybrid bonds at even lower temperatures than low temperatures used conventionally.

Example Systems and Processes

Figure 3:
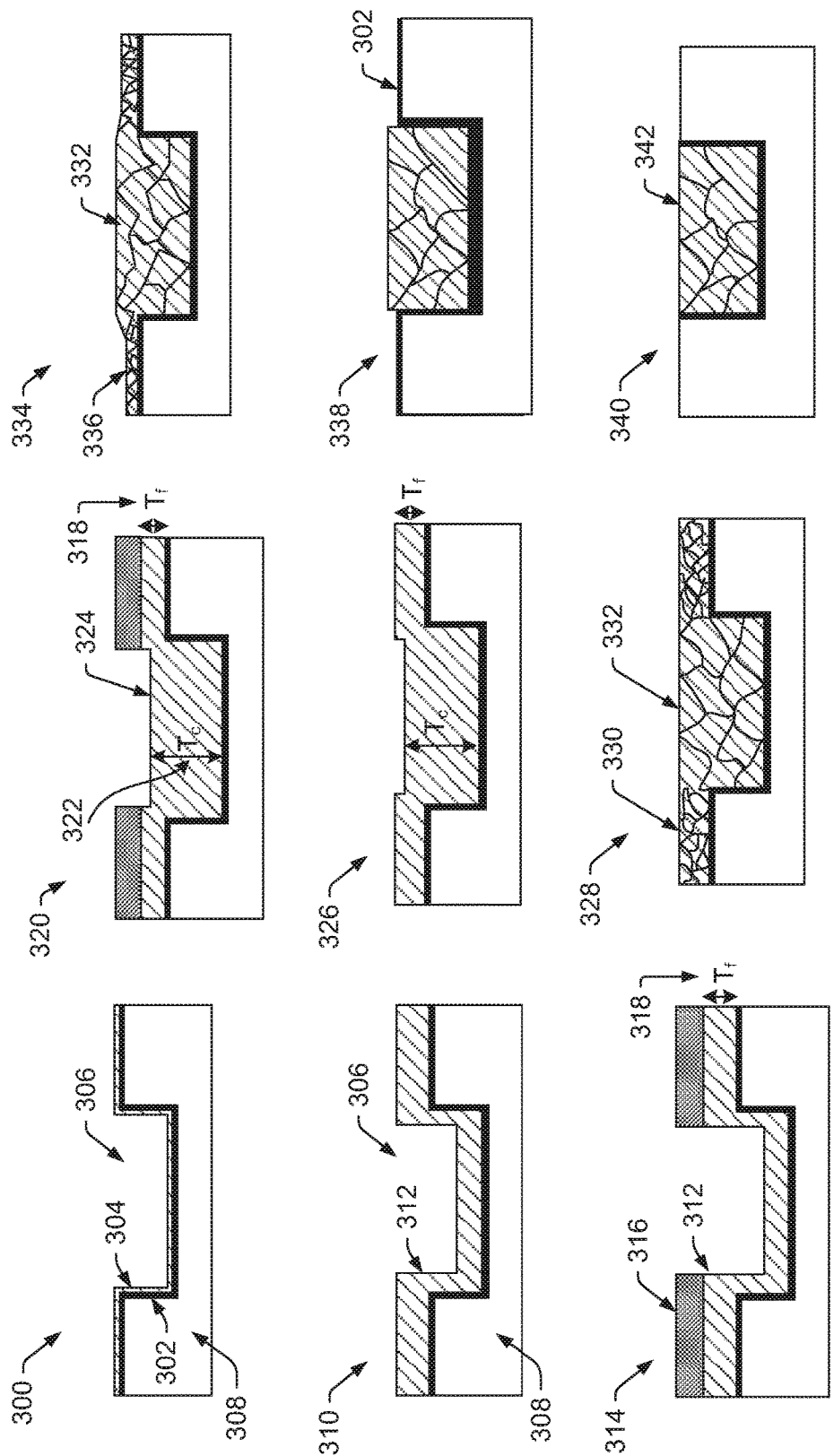
FIG. 3 is a diagram showing an example process for forming a large planar metal feature for microelectronics.

FIG. 3 shows an example process for forming a large flat metal feature for microelectronics. In general, the example process includes creating a pattern of cavities for metal features on a substrate of a microelectronic device, forming a metal layer on the patterned substrate, wherein the metal in the cavities is thicker than the metal coating at the field of the substrate, and then annealing the substrate and/or the metal at a temperature, for example, in the range of temperatures between 25-350° C. for a period of time varying between 30 seconds to 48 hours. For example, the variables may depend on the plating bath additives and the concentration of impurities in the plated metal. The lower the impurity concentration in the plated metal, the lower the needed annealing temperature. Annealing at lower temperatures may be performed at a temperature in a range from room temperature to 100° C., for about 60 minutes, but in some circumstances from 4-48 hours. Similarly, the thicker the plated metal over the cavity, the lower the preferred annealing temperature. The annealing process generates metal grains of different sizes, with the sizes of the metal grains related to a thickness or a depth of the metal at each location on the substrate, including over the damascene cavities. In some examples, a higher temperature process may be utilized for a relatively shorter duration or, conversely, a lower temperature process may be utilized for a relatively longer length of time. The cavities formed have relatively large metal grains, while the metal coating on the field of the substrate has relatively small metal grains as compared to the grains in the cavity. In an implementation, a width of the grain size of a conductor within the conductive layer-filled cavity is more than 5% of the width of a cavity containing the metal feature.

The metal is then planarized. The relatively larger metal grains in the cavity undergo removal more slowly than the relatively smaller metal grains of the field, forming a slightly raised or domed surface over the cavities. Further polishing results in a substantially flat metal feature. By controlling these various aspects, flat metal features are achieved without having a significant dishing defect from the planarization stages.

FIG. 3 further illustrates an implementation in which a barrier layer and a first seed layer are first deposited in a preformed cavity and on the field. The example process then includes depositing the metal on the first seed layer to partially fill the cavity and cover the field of the substrate with the metal, wherein the field layer of the metal has a depth of less than 0.6 microns and preferably less than 0.3 microns. Resist masking is selectively applied over the field portion of the substrate. Additional metal is deposited in the cavity to create a cavity layer of the metal thicker than the field layer of the metal. The resist masking is then cleaned or removed. It is of note that the thickness of the metal in the cavity $T_c$ is substantially larger than the thickness of the metal in the field $T_f$. In some embodiments, the depth of the cavity may vary between 1 to 7 microns or even higher and the ratio of metal thickness in the cavity ($T_c$) to that of the field metal ($T_f$) is at least 1.5 to 12 or even higher. The example process then includes thermally annealing the metal coated substrate at temperatures between 25-350° C. for times varying between 30 seconds up to 48 hours to form larger metal grains in the cavity and smaller metal grains in the field portion of the substrate. A chemical-mechanical planarization (CMP) process is performed on the substrate to remove material down to the barrier layer. Then, the barrier/adhesion layer covering the field is removed. While the process may be described with regard to one cavity, it should be appreciated that the technique can be expanded for multiple cavities of varying size across a given substrate. The cavity(ies) may have any of a number of shapes including round, square, polygonal, elongated, linear, or other suitable feature shape as needed for a given application.

FIG. 3, diagram 300 shows a barrier layer 302 and seed layer 304 coating placed in a large damascene cavity 306 in a substrate 308. In diagram 310, metal 312 is deposited over the substrate 308 to at least partially fill the large damascene cavity 306. The thickness of metal deposited on the field of the substrate may be less than 0.6 microns, and preferably less than 0.3 microns, for example.

In diagram 314, a resist masking 316 is selectively applied on the top surface of the metal 312 on the field of the substrate. In diagram 314, the thickness of the field metal 318 (e.g., less than 0.6μ) is less than the thickness of the cavity metal 322, to be placed in diagram 320. In diagram 320, additional metal 324 is plated or deposited in the unmasked large cavities, to form a thicker metal deposit 322 in the cavities, further assuring that the cavity metal 322 is thicker than the field metal 318. In diagram 326, the resist masking 316 is then cleaned off.

In diagram 328, an annealing process is applied, preferably at temperatures between 25-200° C. for times varying between 10 minutes to 2-12 hours, forming relatively smaller grains 330 of the metal in the thinner layer of the field metal 318, and forming relatively larger grains 332 of the metal in the thicker cavity metal layer 322.

In some applications after the metal coating step of diagram 320, the plated substrate may be annealed with the resist layer 316 if the annealing temperature is kept below 150° C., for example. A CMP method is then used to remove the resist layer 316 and the unwanted metal overburden in the field $T_f$.

In diagram 334, the large grains 332 of metal in the thicker cavity layer 322 resist an intermediate CMP process more than the smaller grains 330 of the metal in the thinner field layer 318, leaving a dome or raised surface 336 over the cavities. In diagram 338, the conductive metal is planarized, stopping at the barrier layer 302. In diagram 340, the barrier layer 302 is removed leaving a large planar damascene pad 342 or conductive feature, having a span of 10μ, or more, for example.

Figure 2:
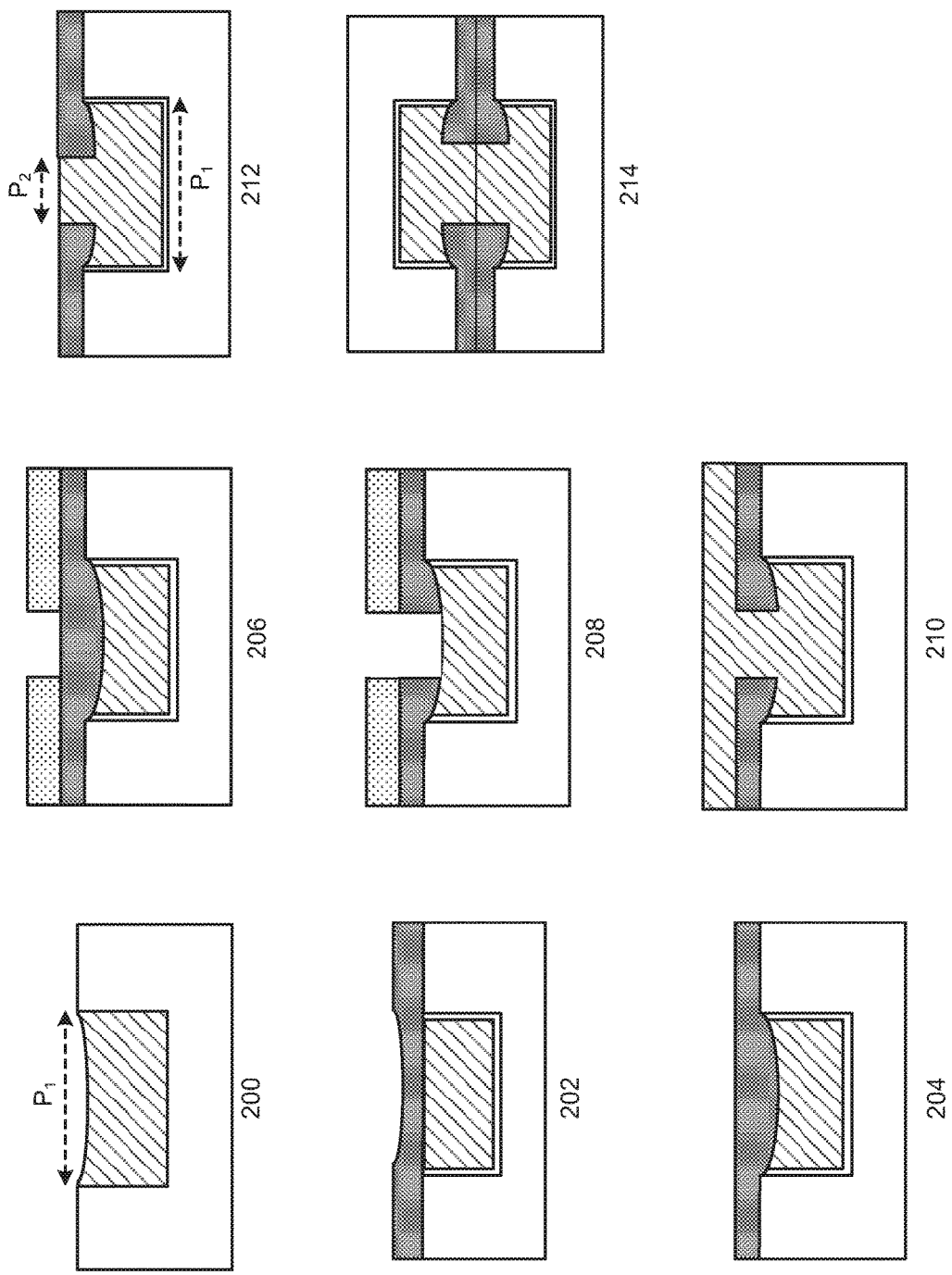
FIG. 2 is a diagram of a conventional approach for creating bonded damascene features, when dishing defects are conventionally present.
Figure 4:
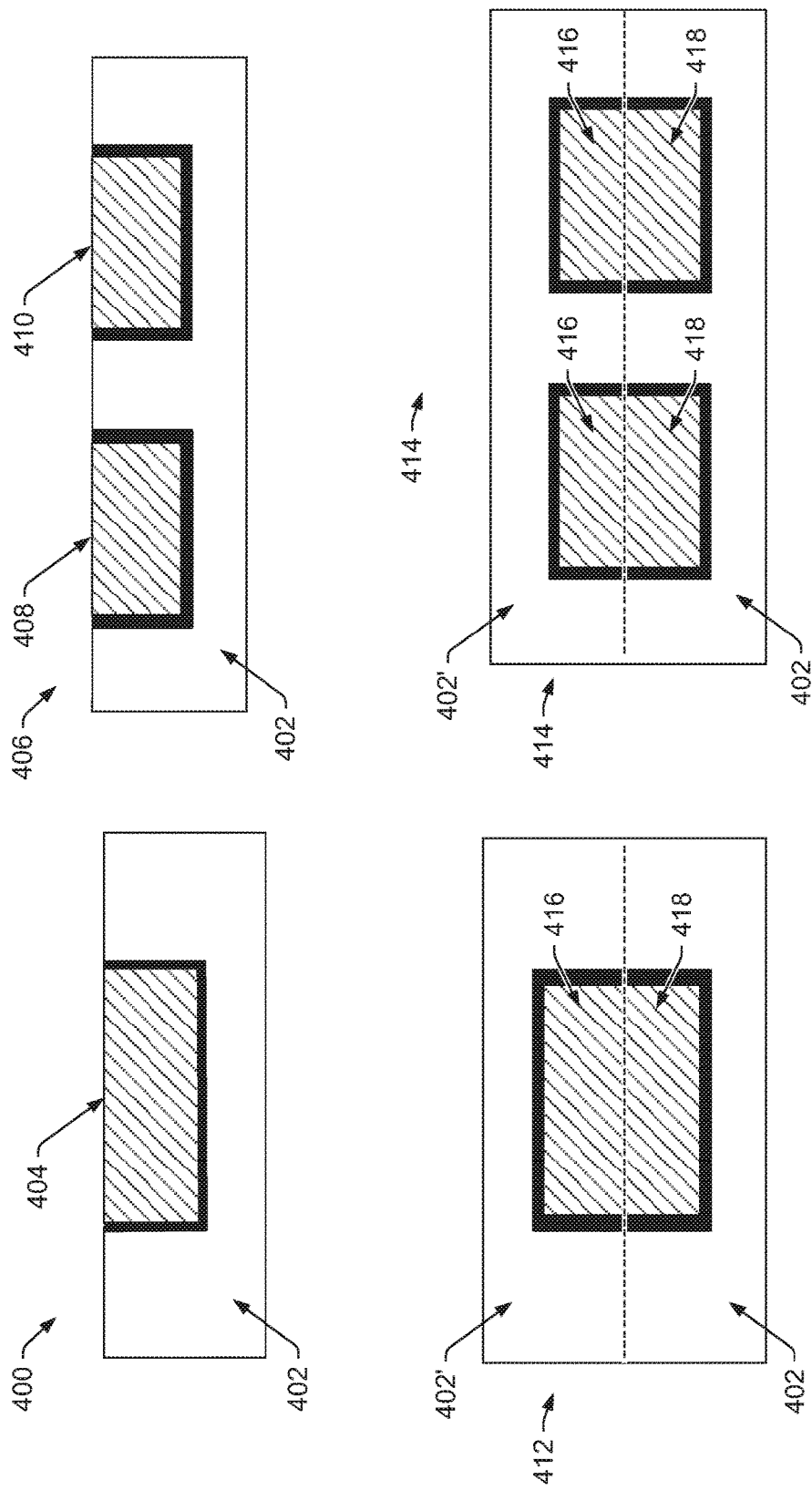
FIG. 4 is a diagram showing continuation steps of the example process of FIG. 3.

In FIG. 4, at diagram 400, the surfaces of the substrate 402 with a large metal pad 404 or, in diagram 406, a substrate 402 with multiple large pads 408 & 410 are processed for bonding. Diagrams 412 and 414 depict assembled and bonded substrates 402 & 402', from the substrates that have one or more of the large conductive features in diagrams 400 and 406. In some of these embodiments, the DBI® hybrid bonding layer is freed from conventional limitations. When a DBI® hybrid bonding layer is conventionally used (for example, referring to FIG. 2), the pad P$_2$ is conventionally limited to being smaller than the width of the pad P$_1$ beneath, as in diagram 212. But the example methods and structures described herein enable elimination of such DBI® hybrid bonding layer limitations from the structure of the substrates, so that the top bonding pad 416 or via may be the same area as the pad 418 beneath.

Figure 5:
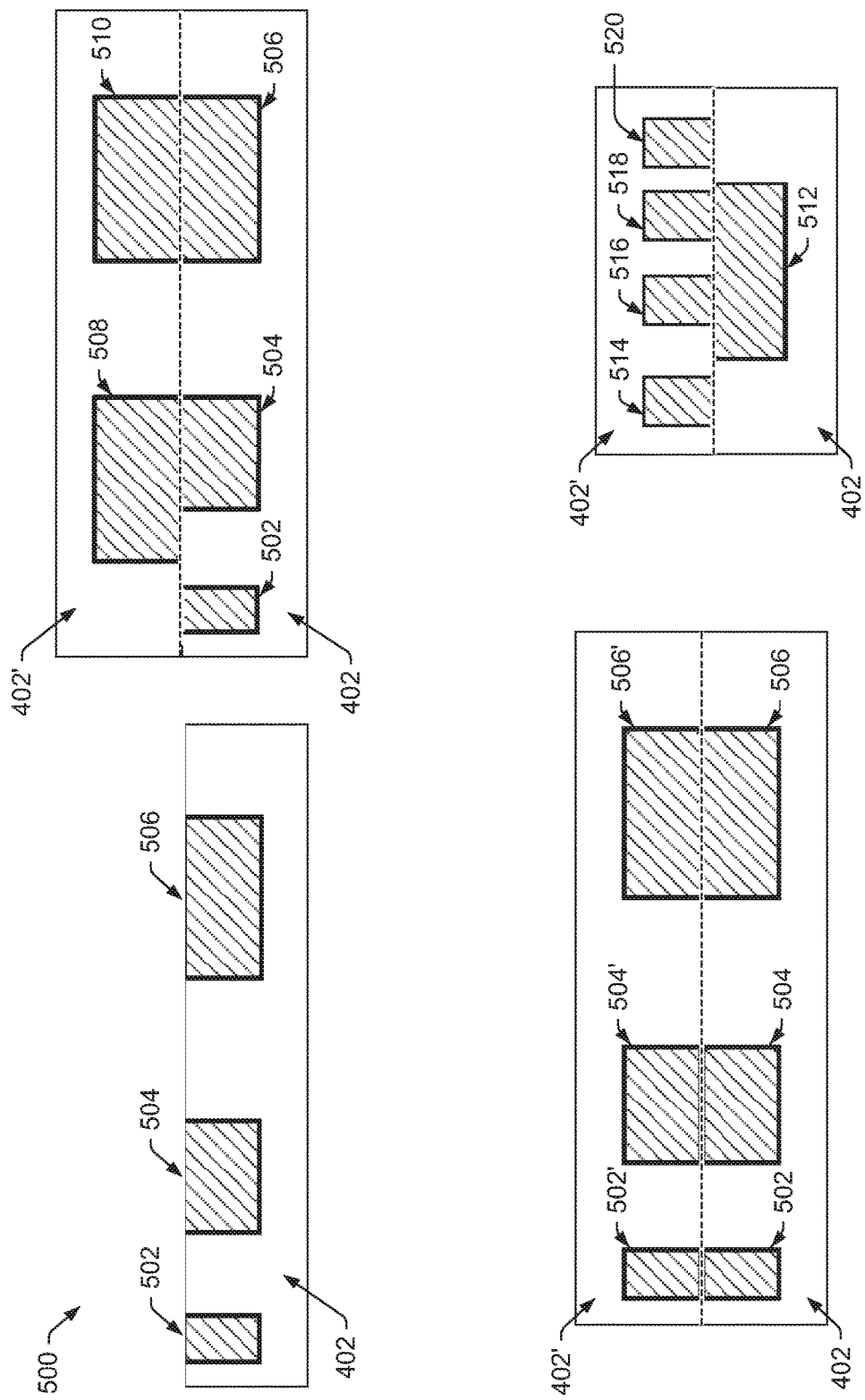
FIG. 5 is a diagram showing continuation steps of the example process of FIG. 3.

In FIG. 5, diagram 500 shows embodiments in which the polished metal features 502 & 504 & 506 bond with other instances of the polished metal features on substrates being bonded together. The polished metal features 502 & 504 & 506, as from the polish stage 340 shown in FIG. 3, have widths varying from submicron scale to cavities larger than 30 microns.

In one embodiment, the width of one of the metal filled cavities of the bonded apparatus in FIG. 5 is more than 2 to 5 times the width of another metal filled cavity in the apparatus.

In other embodiments, the width of the planar cavities may exceed 40 microns, but the related dishing is less than 3 nm and less than 10 nm total across the surface of a die on the substrate or across the surface of the planarized substrate 402. The planarized substrates 402 & 402' with conductive features 504' & 506' & 508' of varying widths made possible by the example methods described herein are further processed. This may include activating the surface of the dielectric layer, and also the metallic layer in some instances, then assembling face-to-face and contact-bonding together. In some applications, both corresponding and non-corresponding large metal cavities with their metal features are aligned and bonded, such as large metal features 508 & 510 to smaller metal features 504, and smaller metal features 514 & 516 & 518 & 520 to larger metal feature 512. One or more traces, trenches, or vias may be bonded to larger conductive pads, enabled and facilitated by the highly planar surfaces of the metal features afforded by the example processes described herein.

Figure 6:
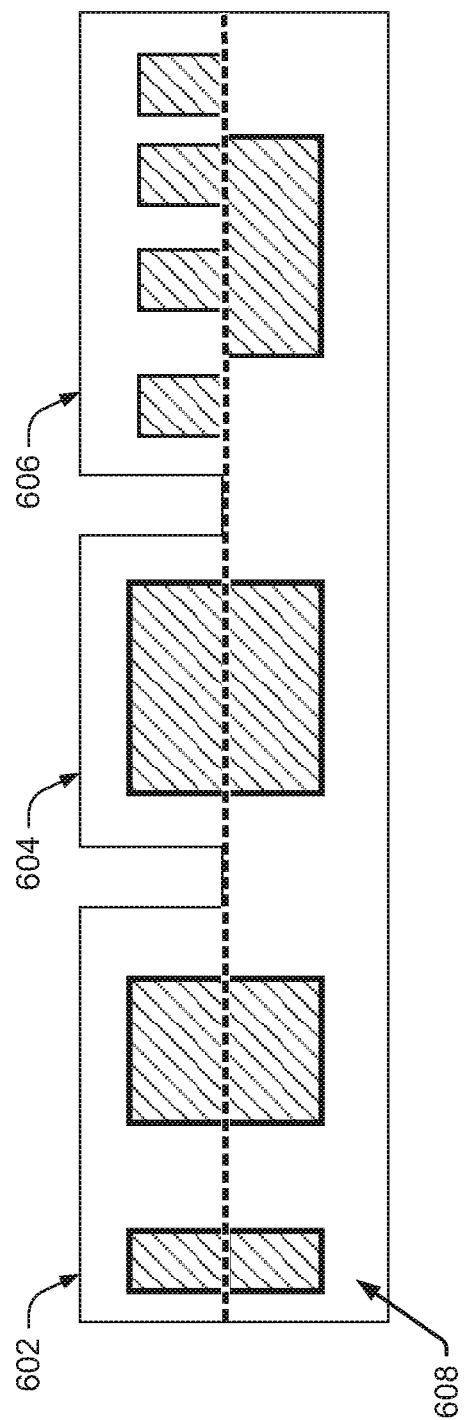
FIG. 6 is a diagram showing continuation steps of the example process of FIG. 3.

FIG. 6 shows one or more smaller dies 602 & 604 & 606 comprised of pads, trenches, vias of various sizes bonded to a larger substrate 608 comprised of pads, trenches and vias of various sizes. In some applications, the width of the vias, trenches or pads on the bonding surfaces of substrate 608 and dies 602, 604 and 606 may be between approximately 0.5-100 microns. Thus, the width of a conductive layer in a portion of the bonding surface of the substrate or the dies may be more than 30% the width of another conductive layer disposed on the bonding surfaces.

In the case of the sizes of the dies, the larger substrate 608 of two bonded dies or substrates may be larger than the smaller die 606 by more than 30% and die 606 may larger than die 604 by more than 50%, for example. In some embodiments, the electrical conductive layer or pad on example die 602 may be smaller than the electrical conductive layer or pad on die 604. Also, multiple dies of various thicknesses may be directly bonded to the larger substrate 608. For example, die 602 may be more than 20% thicker than die 604. Similarly substrate 608 may be thicker or thinner than one of the dies directly bonded to it.

In an implementation, a first surface of a second substrate is bonded to a first surface of a first substrate. The first bonding surface of the first substrate is a conductive layer-filled cavity, the cavity having a width of at least 5 microns. A first bonding surface of the second substrate has one or more conductive layer-filled cavities, wherein a width of a grain size of a conductor within a conductive layer-filled cavity is more than 5% of the width of a cavity in the first or second substrate.

Smaller bonded substrates may be microprocessors, memory devices, passive devices, optical devices, mechanical devices, MEMS devices, frequency filters, and/or a direct band gap device, and combinations of these and other devices. In other applications, the back side of a first bonded die or substrate may be processed for subsequent bonding of one or more active devices, passive devices, optical devices, or MEMS devices, as described above. The pads are shown grossly exaggerated to highlight the contact structures; typically, the electrical conductive layers or structures are far smaller in relation to the associated die.

Figure 7:
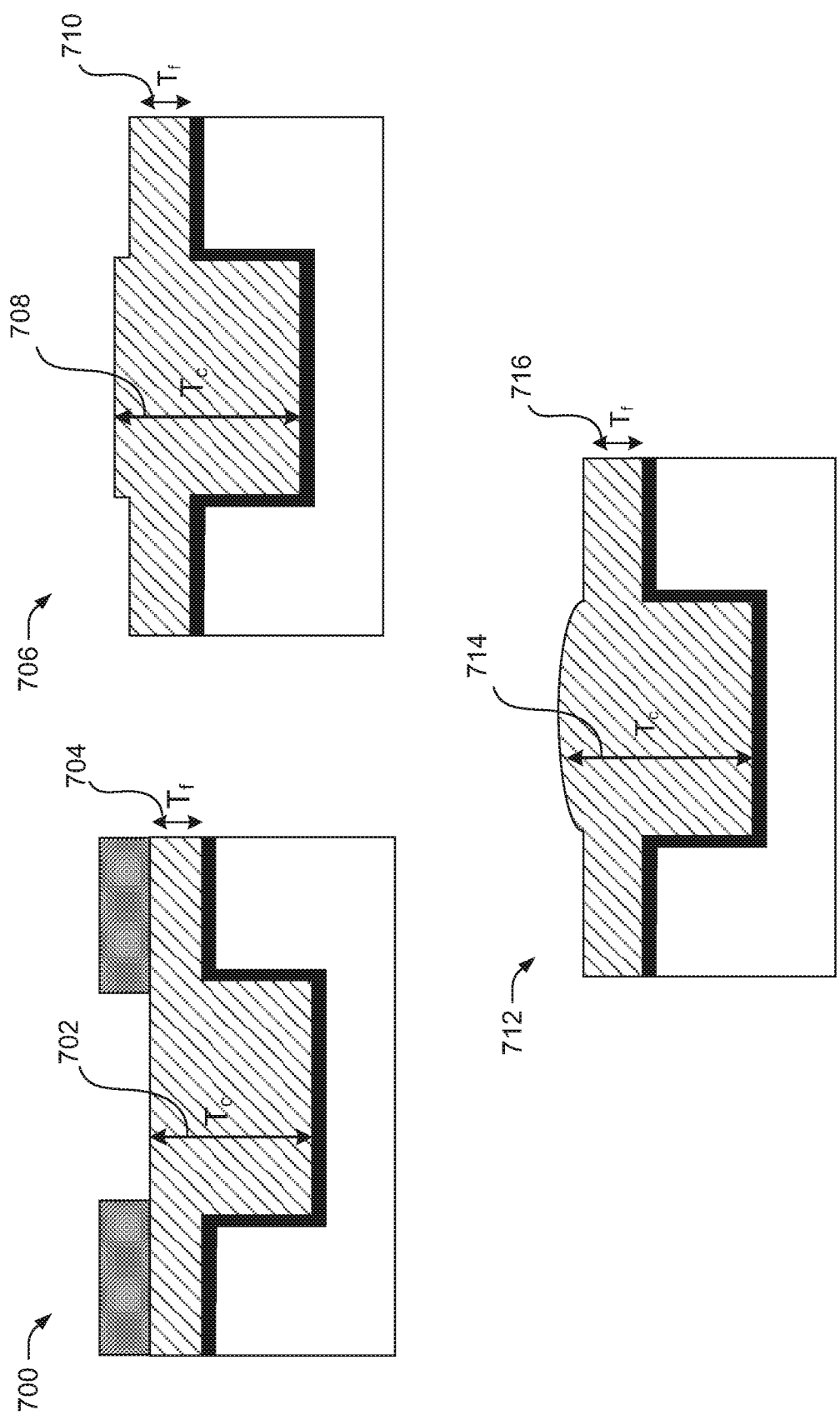
FIG. 7 is a diagram showing example variations of the process shown in FIGS. 3-6.

FIG. 7 shows example variations of the process shown in FIGS. 3-6. In diagram 700, depositing the additional metal in the large cavities includes creating a cavity layer 702 of the metal and a field layer 704 of the metal that have coplanar top surfaces, and the cavity layer 702 of the metal is thicker than the field layer 704 of the metal. In diagram 706, depositing the additional metal in the cavities includes creating a cavity layer 708 of the metal and a field layer 710 of the metal with non-coplanar top surfaces, wherein the surface of the cavity layer 708 is flat and is higher than the surface of the field layer 710. Alternatively, in diagram 712, depositing the additional metal in the cavities includes creating a cavity layer 714 of the metal and a field layer 716 of the metal with non-coplanar top surfaces, wherein the surface of the cavity layer 714 is non-flat, such as domed, and is mostly higher than the surface of the field layer 716.

Figure 8:
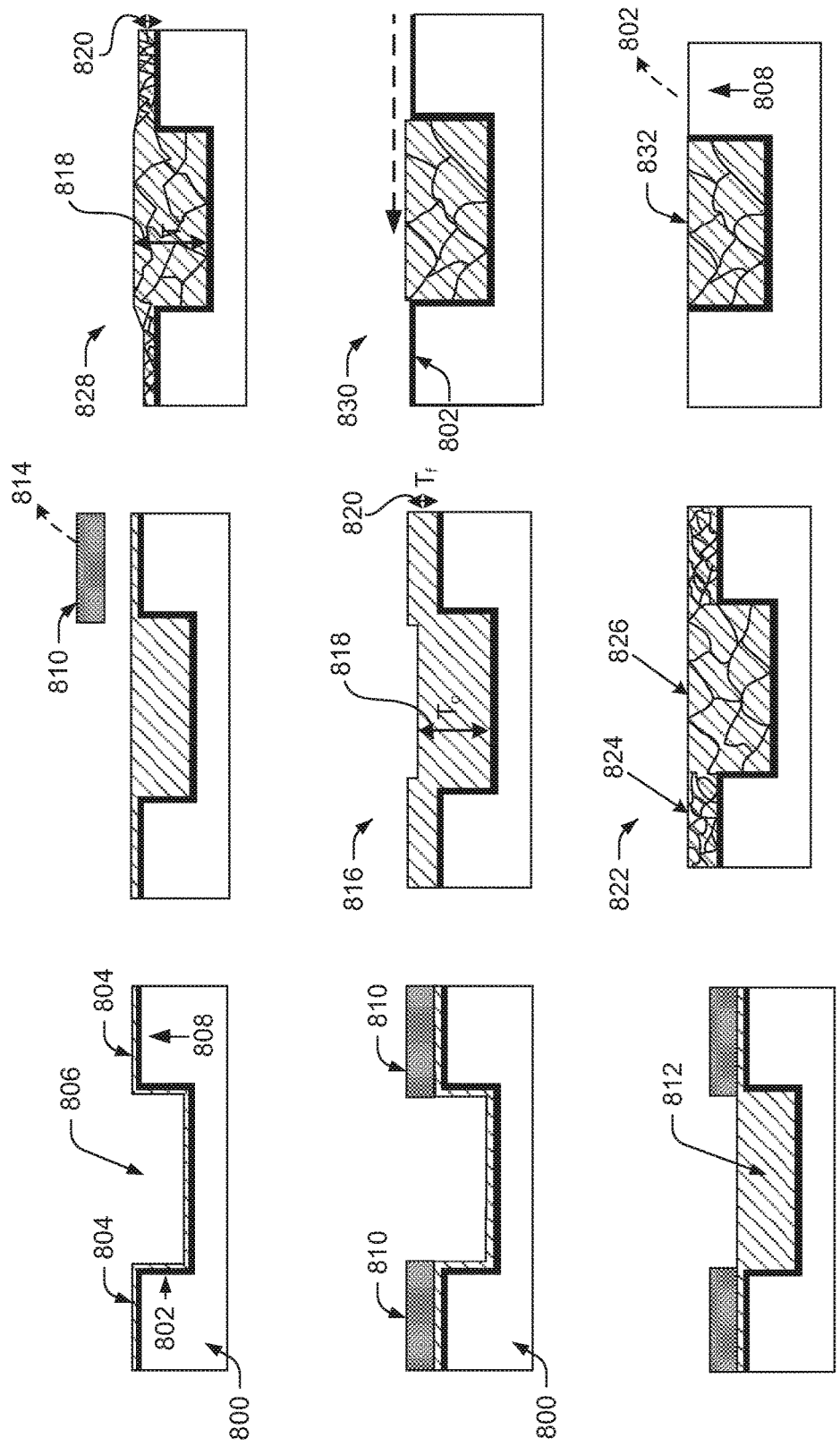
FIG. 8 is a diagram showing an example technique of masking the field of a substrate while plating a thick seed layer to fill damascene cavities with metal, as a variation when forming metal features with different grain sizes in the cavities versus the field, prior to performing CMP.

FIG. 8 shows another example technique for making relatively large flat metal features, with little or no dipping. A substrate 800 is coated with a barrier layer 802 and a metallic seed layer 804, in cavities 806, such as damascene cavities, of the substrate 800 and on a field 808 of the substrate 800. A mask 810 is applied to the field 808 of the substrate 800. The substrate is plated with metal layer 812 to fill the seeded cavity 806.

The resist masking 810 is then removed 814 from the field layer 808. Then, additional metal 816 is deposited over the surface of the substrate 800 without the resist layer to form the new structure 816 with field thickness 820 and corresponding cavity metal 818 and the thickness of metal in the cavity $T_{CU}$ is substantially thicker than the thickness of the metal in the field $T_f$. The process proceeds with thermally annealing 822 the substrate and layers, to make small grained metal 824 crystals over the field 808, and large grained metal crystals 826 in the cavities 806. An intermediate chemical-mechanical planarization (CMP) process 828 is applied on the cavity layer 818 of the metal and the field layer 820 of the metal.

The cavity layer 818 of the metal is then planarized 830 down to the barrier layer 802 covering the field 808. The barrier layer 802 is then removed from the field 808, leaving the large metal damascene features 832 with a high degree of flatness, and with little or no dipping.

Figure 9:
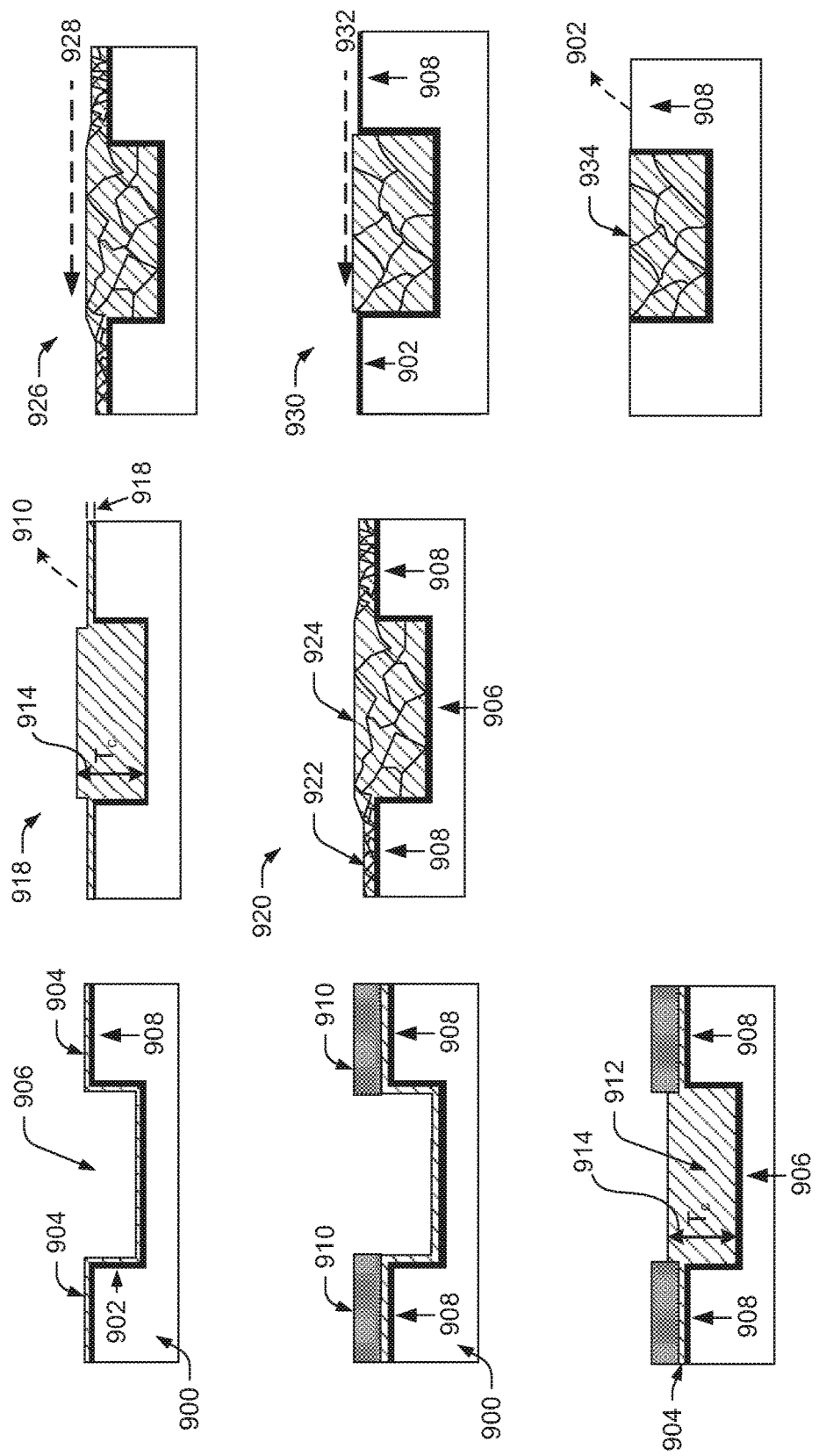
FIG. 9 is a diagram showing an example technique of masking the field of a substrate while plating a thick seed layer to fill damascene cavities with metal to make the plated metal surface of the cavity layer higher than the surface of the field of the substrate, as a variation when forming metal features with different grain sizes in the cavities versus the field, prior to performing CMP.

FIG. 9 shows another alternative process for making large flat damascene features. A substrate 900 is coated with a barrier layer 902 and a metallic seed layer 904, in cavities 906, such as damascene cavities, of the substrate 900 and on a field 908 of the substrate 900. A mask 910 is applied to the field 908 of the substrate 900. A second seed layer may then be applied in the cavities 906, the second seed layer having a thickness of at least 50 nm, for example. The first seed layer 904, or the second seed layer in the cavity 906, as applicable, is then plated or deposited with metal 912 to fill the damascene cavities 906, for forming metal features that have different grain sizes in the cavities 906 than on the fields 908 of the substrate 900, prior to performing CMP. The deposited metal 912 has a thickness 914 that makes the top surface 916 of the deposited metal 912 higher than the top surface of the seed layer 904 under the resist masking material 910.

At 918, the resist masking 910 is then removed from the seed layer 904 of the metal on the field 908 of the substrate 900. At this point, the cavity layer 914 of the metal is thicker than the field layer 918 of the metal.

In some applications the substrate may be annealed with the resist layer 910 over the substrate prior to the removal of the resist layer 910 and the unwanted field metals by CMP methods.

At 920, the process proceeds with thermally annealing the substrate and layers, to make small crystals 922 of grained metal over the field 908, and large crystals 924 of grained metal in the cavities 906.

At 926, an intermediate chemical-mechanical planarization (CMP) process 928 is applied on the cavity layer 914 of the metal and the field layer 918 of the metal.

At 930, the cavity layer 914 of the metal is then planarized 932 down to the barrier layer 902 covering the field 908.

At 934, the barrier layer 902 is then removed from the field 908, leaving the large metal damascene features 934 with a high degree of flatness, and with little or no dipping.

Figure 10:
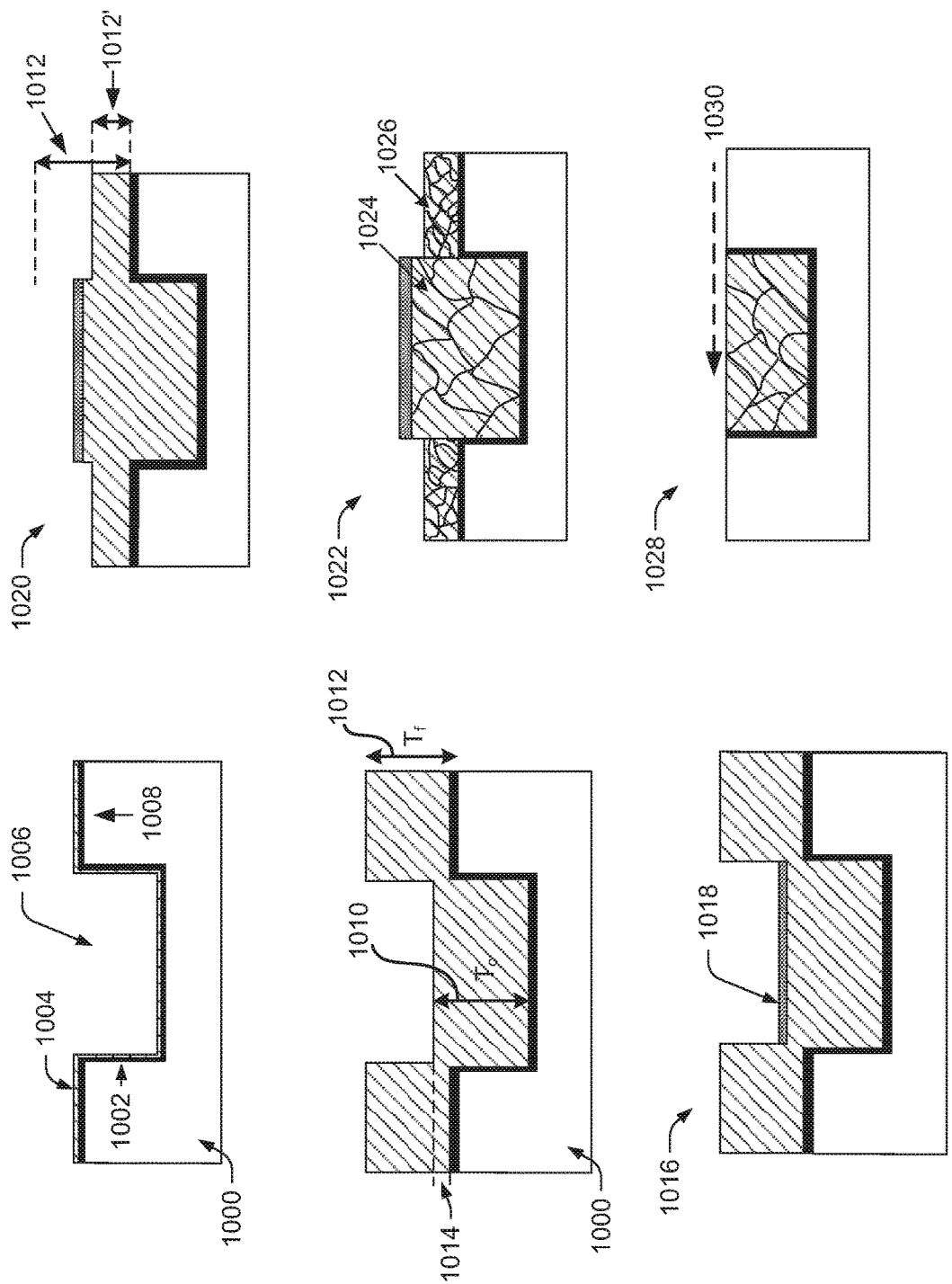
FIG. 10 is a diagram showing an example variation of the example process that includes selectively masking the metal fill over the damascene cavities to minimize dishing during planarization, as a variation when forming metal features with different grain sizes in the cavities versus the field, prior to performing CMP.

FIG. 10 shows another alternative process for fabricating large flat damascene features. A substrate 1000 is coated with a barrier layer 1002 and a seed layer 1004 for depositing metal. A metal fill is deposited or plated on the seed layer 1004, both in cavities 1006 of the substrate 1000 and on the surrounding fields 1008 of the substrate 1000. A cavity layer 1010 of the metal has approximately the same thickness as a field layer 1012 of the metal, but with the field layer 1012 having a greater thickness than an overburden part 1014 over the cavity layer 1010 over the cavities 1006.

At 1016, the top surface of the cavity layer 1010 is selectively covered with a masking material 1018.

At 1020, the field layer 1012 of the metal is etched, so that a thickness of the cavity layer 1010 is now greater than a thickness of the field layer 1012' of the metal.

At 1022, thermal annealing of the metal creates large grains 1024 of the metal in the cavity layer 1010 of the metal and relatively small grains 1026 of the metal in the field layer 1012' of the metal.

At 1028, the cavity layer 1010 of the metal is planarized 1030 down to the barrier layer 1002 covering the field 1008. The barrier layer 1002 is then removed from the field 1008, leaving large flat metal damascene features with a high degree of flatness and little or no dipping.

Figure 11:
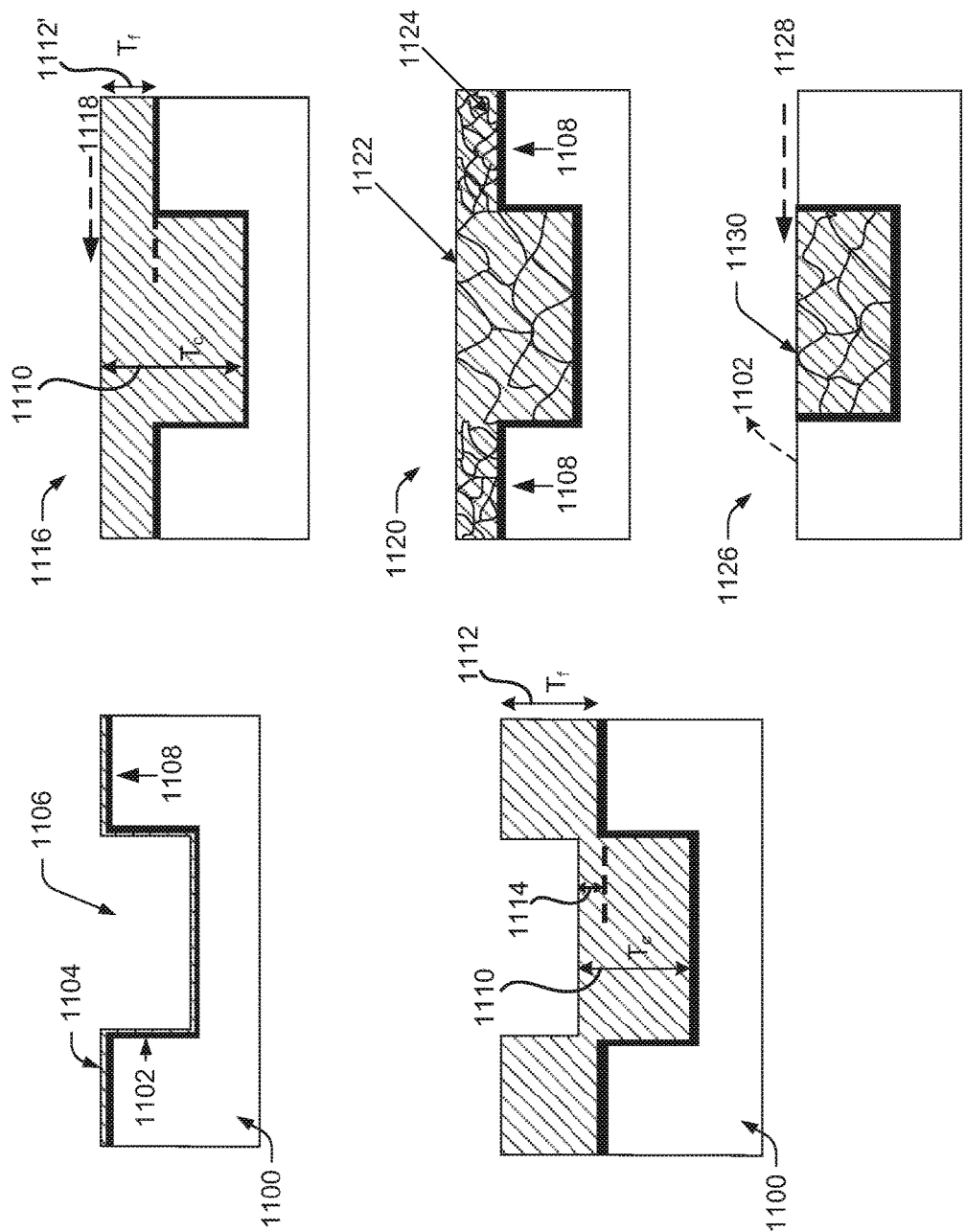
FIG. 11 is a diagram showing an example variation of the example process that includes thinning a field metal thickness before annealing, as a variation when forming metal features with different grain sizes in the cavities versus the field, prior to performing CMP.

FIG. 11 shows another example process that includes thinning a field metal thickness before annealing, as a variation to the previous methods described above.

Starting with a substrate 1100, the example process includes depositing a barrier layer 1102 and a first seed layer 1104 in the cavities 1106 and on the field 1108 of the substrate 1100.

A metal is deposited on the seed layer 1104 in the cavities 1106 and on the fields 1108, creating a cavity layer 1110 of metal that is approximately the same thickness as the field layer 1112 of metal, with the field layer 1112 having a greater thickness than an overburden part 1114 of the cavity layer 1110.

At 1116, the example process includes planarizing 1118 the cavity layer 1110 and the field layer 1112 to a substantially coplanar surface, so that the planarized field layer 1112' has a thickness approximately equal to the overburden part 1114 of the cavity layer 1110, and the field thickness is substantially thinner than the thickness of the metal in the cavity layer 1110. In this embodiment, the key requirement after the first metal removal or forming step is that the thickness of the metal within the cavity $T_c$ is substantially higher than the thickness of the metal in the field $T_f$.

At 1120, the example process includes thermally annealing the metal to create large grains 1122 of the metal in the cavity layer 1110 of the metal and small grains 1124 of the metal in the field layer 1112' of the metal.

At 1126, the cavity layer 1110 of the metal is planarized down 1128 to the barrier layer 1102 covering the field. The barrier layer 1102 is then removed from the field 1108, leaving large area metal damascene features 1130 with a high degree of flatness, and little or no dipping of the top surfaces. In some applications the width of one or more of the large grains in the cavity 1106 is more than 3% of the width the cavity and is more than 10% in other embodiments.

Figure 12:
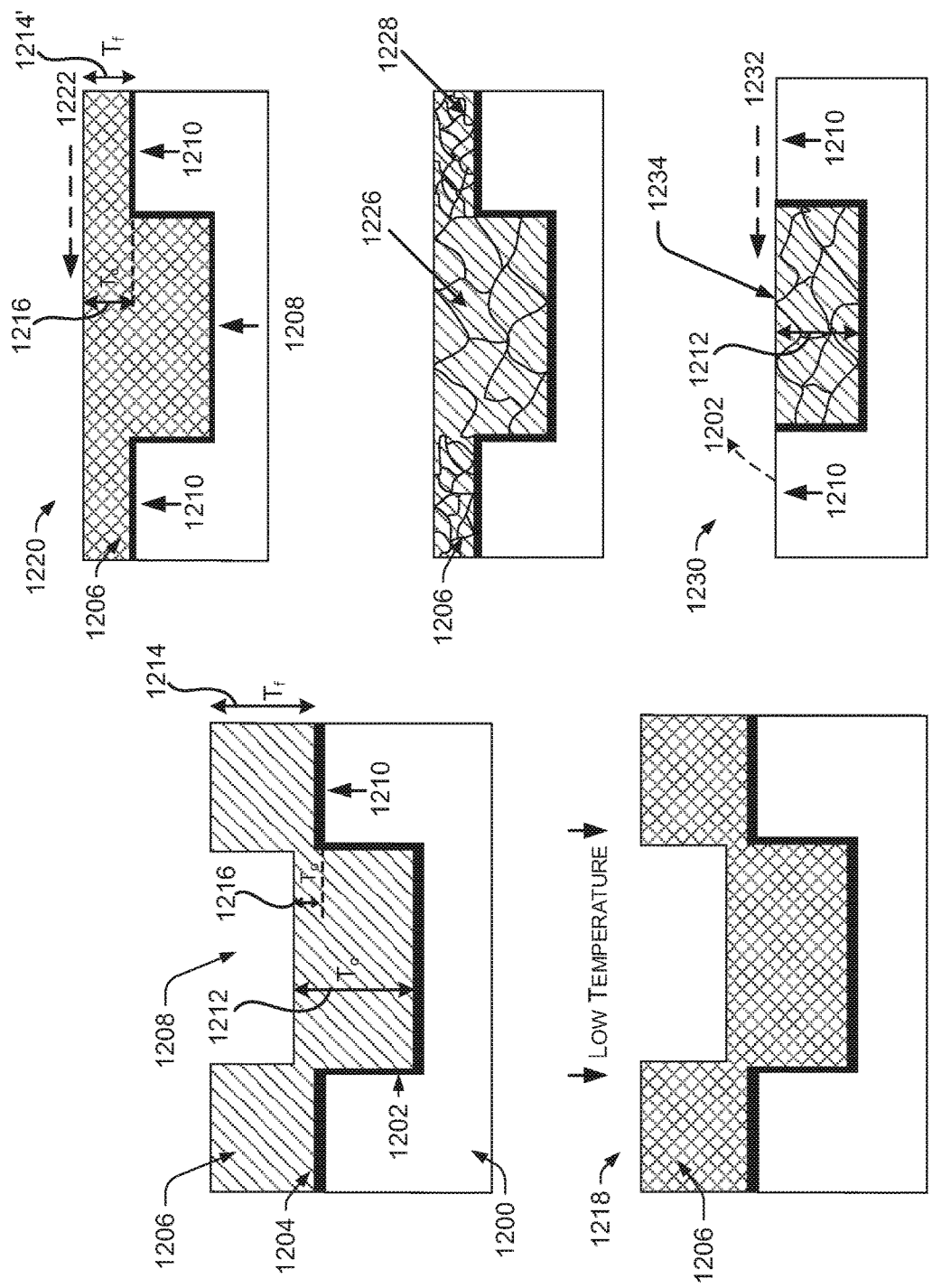
FIG. 12 is a diagram showing an example variation of the example process of storing a substrate at a low temperature before thinning a field metal thickness, and then annealing at temperature to form different grain sizes in the open cavities versus the field of the substrate, prior to CMP.

FIG. 12 shows a variation of the example process for making large flat metal features. A substrate is coated with a barrier layer 1202 and optionally a seed layer 1204, and a metal 1206 is plated or deposited in the cavities 1208 and on the fields 1210 of the substrate 1200. A cavity layer 1212 of the metal has a thickness approximately the same thickness as a field layer 1214 of the metal, and the field layer 1214 has a greater thickness than an overburden part 1216 of the cavity layer 1212 of the metal.

At 1218, the example process includes storing the plated substrate 1200 at a low temperature, for example at a temperature of 10° C. or lower, to preserve the submicron grain size of the plated metal 1206. The lowered temperature also suppresses undesirable grain growth in the plated metal 1206 at room temperature, before thinning the plated metal 1206.

At 1220, the top of the cooled field layer 1214 of metal and the cooled cavity layer 1212 of metal are planarized 1222 preferably at the low temperature for example below 20° C. In one embodiment, the planarized field layer 1214' has a thickness equal to or approximately equal to an overburden part 1216 over the cavity layer 1212 of metal over the cavities 1208. It is preferable that the thickness of the metal in the field 1214 be less than 600 nm and less than 300 nm before the annealing step. Also, in some embodiments, the thickness of the metal over the barrier layer within the cavity may be more than 3 to 50 times the thickness of the planarized field metal 1228.

At 1224, the metal 1206 now planarized, is thermally annealed to create large grains 1226 of the metal in the cavity layer 1212 of the metal and small grains 1228 of the metal in the planarized field layer 1214' of the metal.

At 1230, the cavity layer 1212 of the metal is planarized 1232 down to the barrier layer 1202 covering the field 1210. The barrier layer 1202 is then removed from the fields 1210, leaving the large metal features 1234 that have a high degree of flatness, with little or no dipping across their top surfaces.

Figure 13:
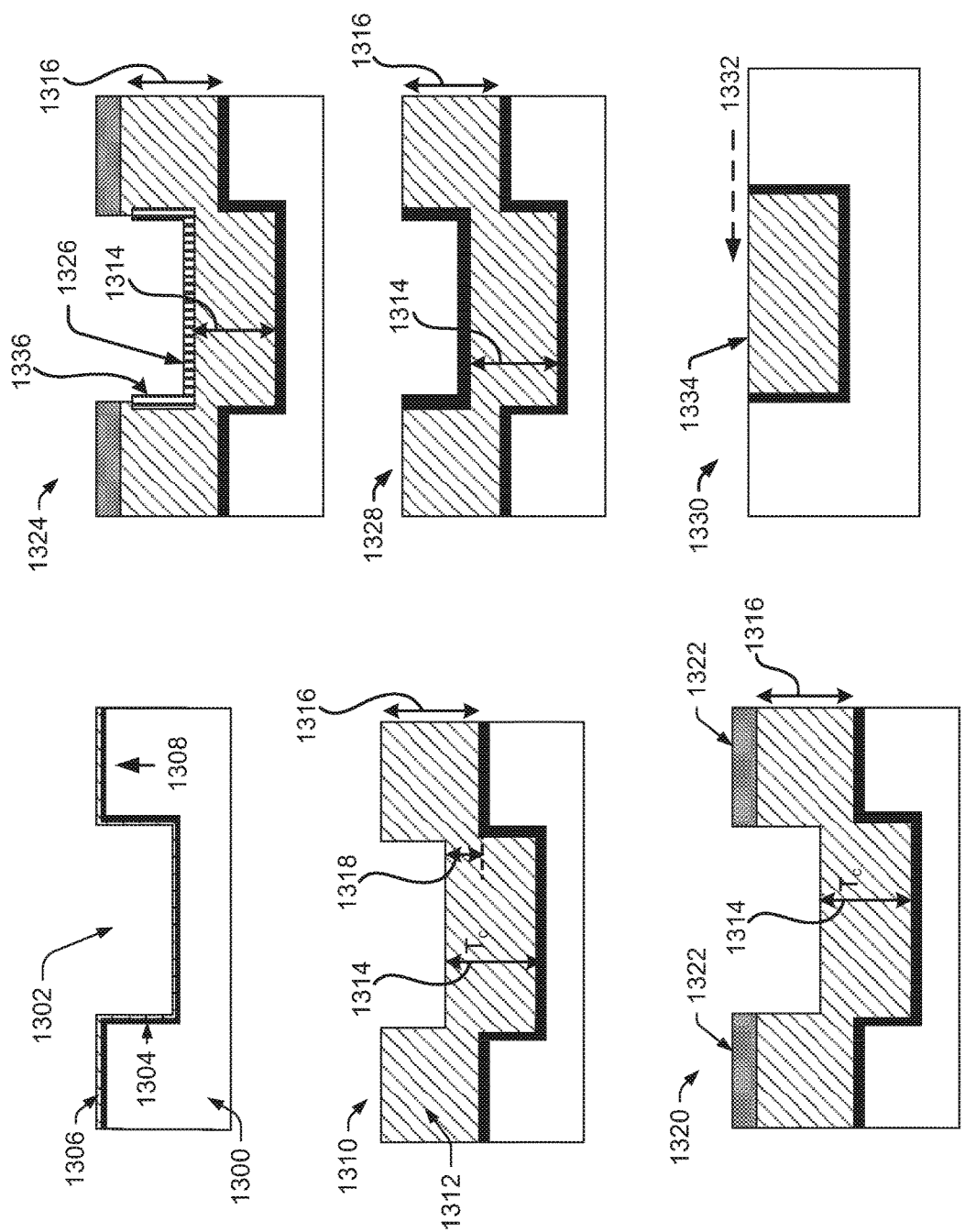
FIG. 13 is a diagram showing another example method of creating planar large damascene metal features, using selective coating on surfaces of the features to resist planarization forces that cause the dishing defect.

FIG. 13 shows another example method of creating planar large damascene metal features. The example method of FIG. 13 prevents dishing of the large metal features by selectively coating the surface of the features to resist planarization forces that cause the dishing defect. The example process of FIG. 13 may be used alone, or in conjunction with the formation of large metal grains that resist dishing, as in the methods described above.

Starting with a substrate 1300, the example method begins with creating trenches or cavities 1302 for the metal features in the substrate 1300. A barrier layer 1304 and a first seed layer 1306 are deposited in the cavities 1302 and on fields 1308 of the substrate.

At 1310, a metal 1312 is deposited, for example on a seed layer in the cavities 1302, and on the fields 1308 to make a metal cavity layer 1314 of metal filling the cavities 1302, the cavity layer 1314 approximately the same thickness as the field layers 1316, and the field layer 1316 having a greater thickness than an overburden part 1318 of the cavity layer 1314.

At 1320, a resist masking layer 1322 is applied over the field layers 1316 but not over the cavity layer 1314.

At 1324, the example method continues with selectively applying a coating of a material 1326 over the cavity layer 1314 of metal. The coating 1326 may be an electrolytic material, a spin-on dielectric material, or an electrolessly coated layer, for example.

Next, at 1328, the resist masking 1322 is cleaned from the field layer 1316 of metal.

At 1330, the cavity layer 1314 of the metal and the field layer 1316 of metal are planarized 1332, leaving large flat metal damascene features 1334. The planarization 1332 may be a chemical-mechanical planarization (CMP) process over the cavity layer 1314 and the field layer 1316 of the metal that achieves the flat conductive metal features 1334. The coating 1326 on the cavity layer 1314 protects the cavity layer 1314 at least in part from the CMP process 1332 and prevents a dishing of the cavity layer 1314 while the CMP process 1332 removes the field layer 1316.

In an implementation, selectively applying a coating 1326 of material over the cavity layer 1314 includes selectively applying the coating 1326 over the cavity layer 1314 and on sidewalls 1336 of the field layer 1316 adjacent to the cavity layer 1314 but not over the resist masking layer 1322 over the field layer 1316.

Figure 14:
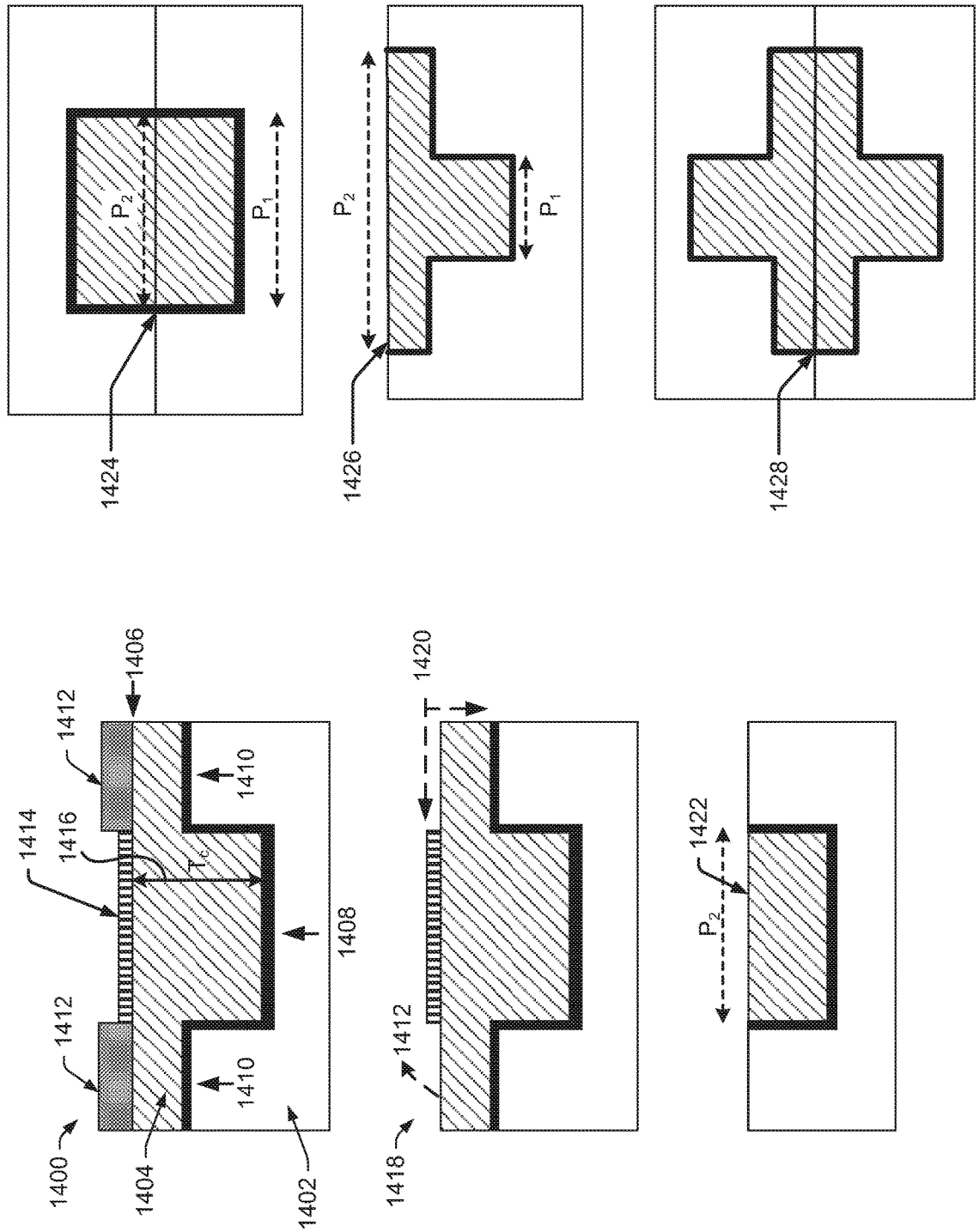
FIG. 14 is a diagram showing an example variation of the example method of FIG. 13 of selectively coating the surface of the damascene features to resist planarization forces that cause dishing defects.

FIG. 14 shows a variation of the example method of FIG. 13, which describes selectively coating the surface of the damascene features to resist planarization forces that cause the dishing defect on large metal features.

At 1400, an etched substrate 1402 is plated with metal 1404 and planarized to obtain a substantially planar surface 1406 over both the cavities 1408 and fields 1410 of the substrate 1402.

On the planar surface 1406, resist masking 1412 is placed over the fields 1410 of the substrate. A coating 1414 of a material is also selectively applied over the unmasked cavity layer 1416 but not over the resist masking layer 1412.

At 1418, the resist masking 1412 is removed, and the material coating 1414 is planarized 1420 to provide large damascene metal features 1422 that have a high degree of flatness, with little or no dipping across the top surface of the large metal features 1422.

The large planar metal features 1422 with little or no dipping across the top surfaces can be bonded together 1424 from different substrates, providing a substantial improvement over conventional limitations, such as that in diagram 212 (FIG. 2), where dimension P$_2$ of a bonding surface made by conventional damascene methods applied to a die or substrate is necessarily less than dimension P$_1$ of the conventional die or substrate. At example bonding interface 1424 (FIG. 14), the dimension of the bonding surface P$_2$ can be equal to (1424) or greater than (1426) dimension P$_1$. This provides example structures, such as large metal bonding interface 1428, that are not possible to produce, or not possible to easily produce conventionally without numerous extra steps that would make such a process conventionally unfeasible.

Thus, the bonding surface of structure 212 conventionally comprises a second pad with a dimension P$_2$ smaller than the width of the first pad P$_1$ beneath. This conventional approach results in a loss of wiring freedom or design flexibility, limiting the use of coplanar large metal and small metal features and components in the bonding surface. The example methods described herein eliminate the restrictions of a smaller planar second pad overlaying a larger first pad, as imposed by the prior art.

The example methods may be applied to form a bonding surface in which a width of the second pad P$_2$ is larger than the width of the first pad P$_1$ beneath. In an embodiment, the width of one of the second pads may be 2-50 times larger than the width of the metal layer beneath. For bonding operations, one or more of the cleaned planarized surfaces may be activated in a gentle nitrogen, boron, or fluoride plasma ambient or combinations thereof. The clean prepared surfaces are assembled with intimate contact and can be bonded by further thermal treatment of the coupled substrates.

In an implementation, and example apparatus has a first substrate beneath a second substrate, a bonding surface of the first substrate bonded to a bonding surface of the second substrate, and the bonding surface of the first substrate has conductive layer-filled cavities. A conductive layer-filled cavity of the bonding surface of the first substrate has a width of at least 5 microns, and the bonding surface of the second substrate also has conductive layer-filled cavities. A width of a conductive layer-filled cavity of the bonding surface of the second substrate is 2-20 times larger, for example, than a width of a conductive layer-filled cavity of the first substrate beneath the bonding surface of the second substrate.

Referring back through FIGS. 3-15, in some applications, the barrier layer may serve as the seed layer. While in other applications, the seed layer and the plated material comprise similar materials.

Figure 15:
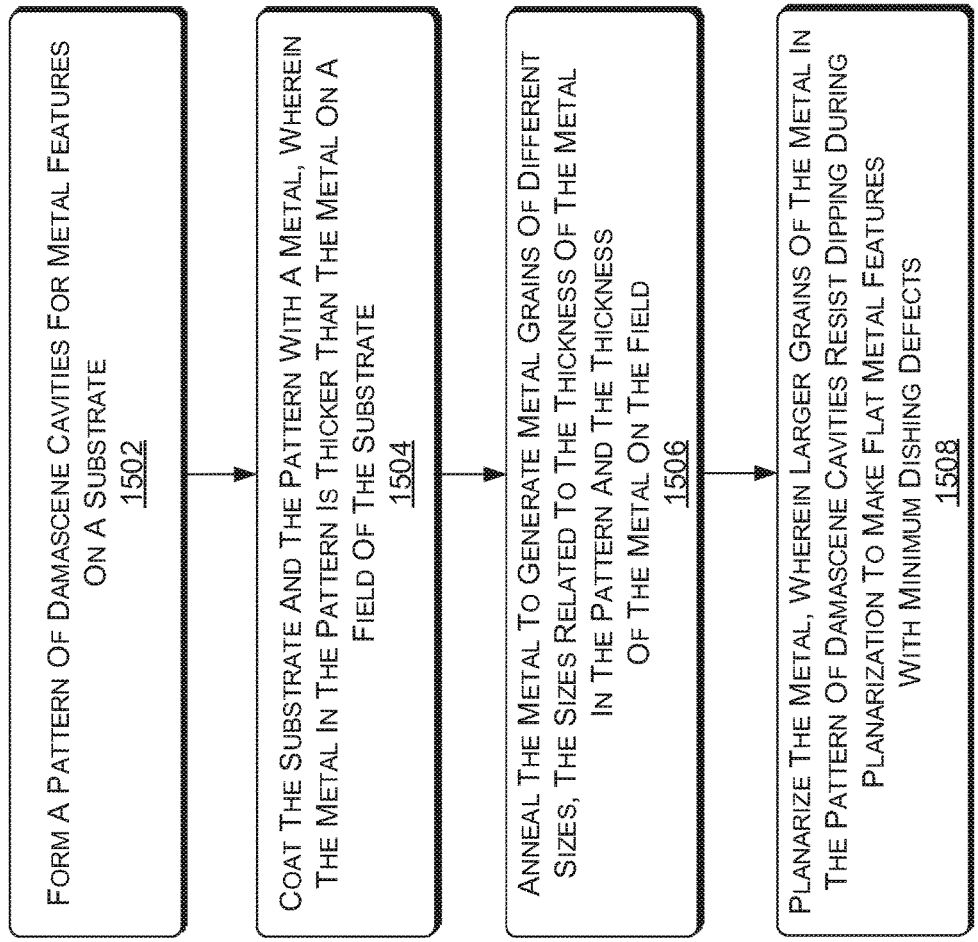
FIG. 15 is a flow diagram of an example method of creating large flat conductive features.

FIG. 15 shows an example method 1500 of creating large flat damascene conductive features. In the flow diagram, operations of the example method 1500 are shown in discreet blocks.

At block 1502, a pattern of damascene cavities for metal features is etched or formed in or on a substrate for a microelectronic device.

At block 1504, the substrate and the pattern are coated with a deposited metal, wherein the metal within the pattern of the damascene cavities has a greater thickness than the thickness of the metal on the field of the substrate.

At block 1506, the metal is annealed to generate metal grains of different sizes, the sizes of the metal grains related to a thickness or a depth of the metal at each location over the un-etched substrate and over the etched pattern of damascene cavities, the metal in the pattern of damascene cavities annealing to relatively large metal grains and the metal that is coating the fields of the substrate annealing to relatively small metal grains.

At block 1508, the metal is planarized, wherein the large metal grains in the pattern of damascene cavities planarize to flat metal features with a minimum dishing defect from the planarization.

The example method 1500 may end at block 1508, with the flat metal features planarized with a minimum dishing defect. Variations of this example method, and other processes useful for forming the large flat metal features, are also shown in FIGS. 2-14.

Figure 16:
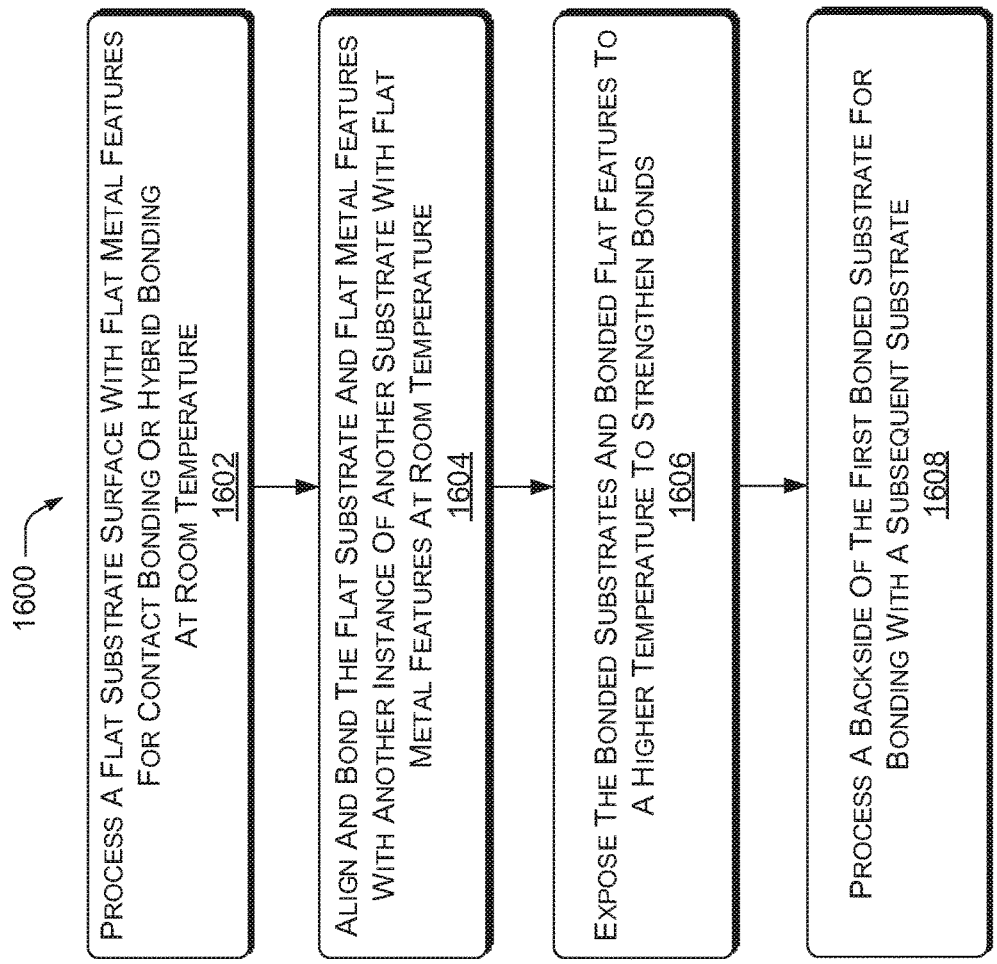
FIG. 16 is a flow diagram of an example continuation method of the example method shown in FIG. 15.

FIG. 16 shows optional continuation steps 1600 of the example method 1500, for further processing.

At block 1602 the surface of the planar substrates with flat metal features are processed for bonding.

At block 1604 the processed surface of the substrate is aligned and bonded face-to-face with another instance of a processed surface of another substrate that has flat metal features, at room temperature or at low temperatures.

At block 1606 the bonded substrates are thermally exposed to a higher temperature in order for the opposing conductive layers of the opposing flat metal features to fuse together permanently.

At block 1608, a backside of the first bonded substrate is processed for bonding with another additional substrate.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. An apparatus comprising:
a first substrate comprising a first bonding surface that comprises a first conductive layer-filled cavity, the first conductive layer-filled cavity having a first width of at least 5 microns and a first depth that is less than the first width; and
a second substrate comprising a second bonding surface that comprises a second conductive layer-filled cavity, wherein the second conductive layer-filled cavity has a second width and a second depth that is less than the second width and wherein a width of a grain size of a conductor within the second conductive layer-filled cavity is more than 5% of the width of one of (i) the first conductive layer-filled cavity or (ii) the second conductive layer-filled cavity
wherein the first bonding surface is bonded to the second bonding surface.

2. The apparatus of claim 1, further comprising:
a first barrier layer over a surface of the first conductive layer-filled cavity; and
a second barrier layer over a surface of the second conductive layer-filled cavity.

3. The apparatus of claim 1, wherein:
the first bonding surface comprises one of a nitrogen atomic species, a fluoride atomic species, or a boron atomic species; and
the second bonding surface comprises one of a nitrogen atomic species, a fluoride atomic species, or a boron atomic species.

4. The apparatus of claim 1, wherein the first depth is between about 1 to 7 microns and the second depth is between about 1 to about 7 microns.

5. The apparatus of claim 1, wherein the first bonding surface is bonded to the second bonding surface via a hybrid bond direct bond.

6. The apparatus of claim 1, wherein the first width of the first is 2 to 5 times the second width.

7. The apparatus of claim 1, wherein:
the first bonding surface comprise a first flat conductive metal feature having a width of at least 5 microns on the first substrate, wherein a dishing concavity across the width of the first flat conductive metal feature has a maximum dishing depth of less than 10 nanometers for each micron (nm/μ) of depth of the first flat conductive metal feature; and
the second bonding surface comprise a second flat conductive metal feature having a width of at least 5 microns on the second substrate, wherein a dishing concavity across the width of the second flat conductive metal feature has a maximum dishing depth of less than 10 nanometers for each micron (nm/μ) of depth of the second flat conductive metal feature.

8. The apparatus of claim 7, wherein the first flat conductive metal feature and the second flat conductive metal feature are from a group consisting of:
a flat conductive metal feature with a width of at least 10 microns (μm) and a maximum dishing of less than 10 nanometers (nm);
a flat conductive metal feature with a width of at least 10 μm and a maximum dishing of less than 10 nanometers per micron (nm/μm) of depth of the flat conductive metal feature; and
a bonded metallic feature larger than 10 μm.

9. The apparatus of claim 7, wherein the width of the first flat conductive metal feature and the width the second flat conductive metal feature are more than 25 microns and the dishing concavity of the first flat conductive metal feature and the second flat conductive metal feature are each less than 10 nanometers.

10. The apparatus of claim 7, wherein the width of the first flat conductive metal feature and the width of the second flat conductive metal feature are each between 26-150 microns and the dishing concavity of the first flat conductive metal feature and the width of the second flat conductive metal feature are each less than 20 nanometers.

11. The apparatus of claim 1, wherein at least one of the first substrate or the second substrate comprise a microelectronic device.

12. An apparatus comprising:
a first substrate comprising a first bonding surface that comprises a first conductive layer-filled cavity, wherein a conductive layer of the first conductive layer-filled cavity has a width of at least 10 microns, wherein a grain size of a conductor within the first conductive layer-filled cavity is more than 5% of the width of the first conductive layer-filled cavity; and a second substrate comprising a second bonding surface that comprises a second conductive layer-filled cavity, wherein a width of a conductive layer of the second conductive layer-filled cavity is 2-10 times the width of the conductive layer of the first conductive layer filled cavity, wherein the first bonding surface is bonded to the second bonding surface.

13. The apparatus of claim 12, further comprising:

a first barrier layer over a surface of the first conductive layer-filled cavity; and a second barrier layer over a surface of the second conductive layer-filled cavity.

14. The apparatus of claim 12, wherein:

the first bonding surface comprises one of a nitrogen atomic species, a fluoride atomic species, or a boron atomic species; and the second bonding surface comprises one of a nitrogen atomic species, a fluoride atomic species, or a boron atomic species.

15. The apparatus of claim 12, wherein at least one of the first substrate or the second substrate comprise a microelectronic device.

* * * * *